(12) United States Patent
Lee

(10) Patent No.: US 10,790,270 B2
(45) Date of Patent: Sep. 29, 2020

(54) STACKED SEMICONDUCTOR PACKAGE

(71) Applicant: Samsung Electronics Co., Ltd., Suwon-si (KR)

(72) Inventor: Dong-ha Lee, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/505,068

(22) Filed: Jul. 8, 2019

(65) Prior Publication Data

US 2019/0333907 A1    Oct. 31, 2019

Related U.S. Application Data

(63) Continuation of application No. 15/806,618, filed on Nov. 8, 2017, now Pat. No. 10,373,940.

(30) Foreign Application Priority Data

Nov. 10, 2016 (KR) .......................... 10-2016-0149557

(51) Int. Cl.
*H01L 25/00* (2006.01)
*H01L 25/18* (2006.01)
(Continued)

(52) U.S. Cl.
CPC ............ *H01L 25/18* (2013.01); *H01L 21/561* (2013.01); *H01L 23/3107* (2013.01); *H01L 24/09* (2013.01); *H01L 24/24* (2013.01); *H01L 24/32* (2013.01); *H01L 24/48* (2013.01); *H01L 24/49* (2013.01); *H01L 24/73* (2013.01);

*H01L 24/96* (2013.01); *H01L 25/0655* (2013.01); *H01L 25/0657* (2013.01); *H01L 21/568* (2013.01);
(Continued)

(58) Field of Classification Search
None
See application file for complete search history.

(56) References Cited

U.S. PATENT DOCUMENTS 7,994,822 B2    8/2011 Otsuga et al.
9,105,503 B2    8/2015 Kim et al.
(Continued)

FOREIGN PATENT DOCUMENTS

KR    10-0808582    2/2008
KR    10-2010-0088514    8/2010

*Primary Examiner* — Reema Patel
(74) *Attorney, Agent, or Firm* — Muir Patent Law, PLLC

(57) ABSTRACT

Provided is a stacked semiconductor package, which has various kinds of semiconductor chips with various sizes and is capable of miniaturization. The stacked semiconductor package includes a base substrate layer and a sub semiconductor package disposed on a top surface of the base substrate layer. The sub semiconductor package includes a plurality of sub semiconductor chips spaced apart from one another, and a sub mold layer filling spaces between the plurality of sub semiconductor chips to surround side surfaces of the plurality of sub semiconductor chips. The stacked semiconductor package includes at least one main semiconductor chip stacked on the sub semiconductor package, the at least one main semiconductor chip being electrically connected to the base substrate layer through first electrical connection members.

17 Claims, 26 Drawing Sheets

(51) Int. Cl.
  *H01L 21/56*    (2006.01)
  *H01L 25/065*   (2006.01)
  *H01L 23/31*    (2006.01)
  *H01L 23/00*    (2006.01)
  *H01L 25/03*    (2006.01)
  *H01L 23/498*   (2006.01)

(52) U.S. Cl.
  CPC .... *H01L 23/3128* (2013.01); *H01L 23/49816* (2013.01); *H01L 23/49838* (2013.01); *H01L 25/03* (2013.01); *H01L 2224/09155* (2013.01); *H01L 2224/24137* (2013.01); *H01L 2224/32145* (2013.01); *H01L 2224/48091* (2013.01); *H01L 2224/48106* (2013.01); *H01L 2224/48145* (2013.01); *H01L 2224/48227* (2013.01); *H01L 2224/49109* (2013.01); *H01L 2224/49112* (2013.01); *H01L 2224/49176* (2013.01); *H01L 2224/73215* (2013.01); *H01L 2224/73265* (2013.01); *H01L 2225/0651* (2013.01); *H01L 2225/06506* (2013.01); *H01L 2225/06562* (2013.01); *H01L 2924/00014* (2013.01); *H01L 2924/13091* (2013.01)

(56)          References Cited

U.S. PATENT DOCUMENTS

| | | | |
|---|---|---|---|
| 9,258,890 | B2 | 2/2016 | Seguido et al. |
| 9,263,370 | B2 | 2/2016 | Shenoy et al. |
| 2011/0013353 | A1 | 1/2011 | Kwon et al. |
| 2011/0175222 | A1 | 7/2011 | Kim et al. |
| 2012/0080806 | A1* | 4/2012 | Song .................. H01L 23/3128 257/777 |
| 2015/0155265 | A1 | 6/2015 | He et al. |
| 2015/0162316 | A1* | 6/2015 | Yu ........................ H01L 25/105 257/704 |
| 2016/0093598 | A1 | 3/2016 | Jo et al. |
| 2018/0026022 | A1 | 1/2018 | Lee et al. |
| 2018/0301443 | A1 | 10/2018 | Kim et al. |

\* cited by examiner

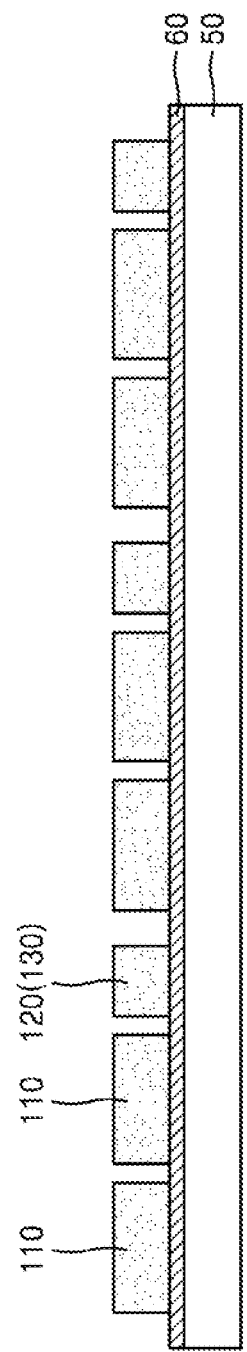

STACKED SEMICONDUCTOR PACKAGE

CROSS-REFERENCE TO RELATED APPLICATION

This application is a continuation application of U.S. patent application Ser. No. 15/806,618, filed Nov. 8, 2017, which claims the benefit of priority to Korean Patent Application No. 10-2016-0149557, filed on Nov. 10, 2016, in the Korean Intellectual Property Office, the disclosure of each of which is incorporated herein in its entirety by reference.

BACKGROUND

The present disclosure relates to a stacked semiconductor package, and more particularly, to a stacked semiconductor package having a plurality of semiconductor chips with various sizes.

With the rapid development of the electronics industry, electronic devices have been fabricated to be downscaled and lightweight and have high capacities. Thus, semiconductor packages including a plurality of semiconductor chips have been developed. Also, semiconductor packages, each of which includes various kinds of semiconductor chips with various sizes, have been developed. It is desirable for these semiconductor packages to continue to decrease in size and weight.

SUMMARY

The disclosed embodiments provide a stacked semiconductor package, which has various kinds of semiconductor chips with various areas, and is capable of miniaturization.

According to an aspect of the inventive concept, a stacked semiconductor package includes a base substrate layer and a sub semiconductor package disposed on a top surface of the base substrate layer. The sub semiconductor package includes a plurality of sub semiconductor chips spaced horizontally apart from one another, a sub mold layer filling spaces between the plurality of sub semiconductor chips to surround side surfaces of the plurality of sub semiconductor chips, and a redistribution structure provided on active surfaces of the plurality of sub semiconductor chips and on the sub mold layer, the redistribution structure including redistribution pads electrically connected to the base substrate layer and a redistribution conductive layer configured to connect at least some of the plurality of sub semiconductor chips with the redistribution pads. The stacked semiconductor package includes at least one main semiconductor chip stacked on the sub semiconductor package, the at least one main semiconductor chip electrically connected to the base substrate layer through first electrical connection members.

According to another aspect of the inventive concept, a stacked semiconductor package includes a sub semiconductor package including a plurality of sub semiconductor chips spaced horizontally apart from one another, a sub mold layer filling spaces between the plurality of sub semiconductor chips, and a redistribution structure including redistribution pads and a redistribution conductive layer configured to connect at least some of the plurality of sub semiconductor chips with the redistribution pads, the redistribution structure on active surfaces of the plurality of sub semiconductor chips and on the sub mold layer, and a plurality of main semiconductor chips, each of which has a same area as the sub semiconductor package, the plurality of main semiconductor chips stacked on the sub semiconductor package in a staircase form.

According to another aspect of the inventive concept, a stacked semiconductor package includes a base package substrate and a sub semiconductor package disposed on the base package substrate. The sub semiconductor package includes a plurality of first semiconductor chips horizontally spaced apart from each other, at least two of which have different areas from each other, when viewed form a plan view; a sub mold layer filling spaces between the first semiconductor chips; and a sub package substrate disposed on the plurality of first semiconductor chips and the mold layer. The stacked semiconductor package further includes at least a second semiconductor chip disposed on the sub semiconductor package. The second semiconductor chip has a larger area than each of the plurality of first semiconductor chips, when viewed from a plan view. The stacked semiconductor package further includes a mold layer covering the sub semiconductor package and the second semiconductor chip. The sub semiconductor package may have the same area as the second semiconductor chip, when viewed from a plan view.

BRIEF DESCRIPTION OF THE DRAWINGS

Various embodiments will be more clearly understood from the following detailed description taken in conjunction with the accompanying drawings in which:

FIGS. 8A to 8F are cross-sectional views of sequential process operations of a method of manufacturing a sub semiconductor package according to an embodiment;

DETAILED DESCRIPTION

Figure 1A:
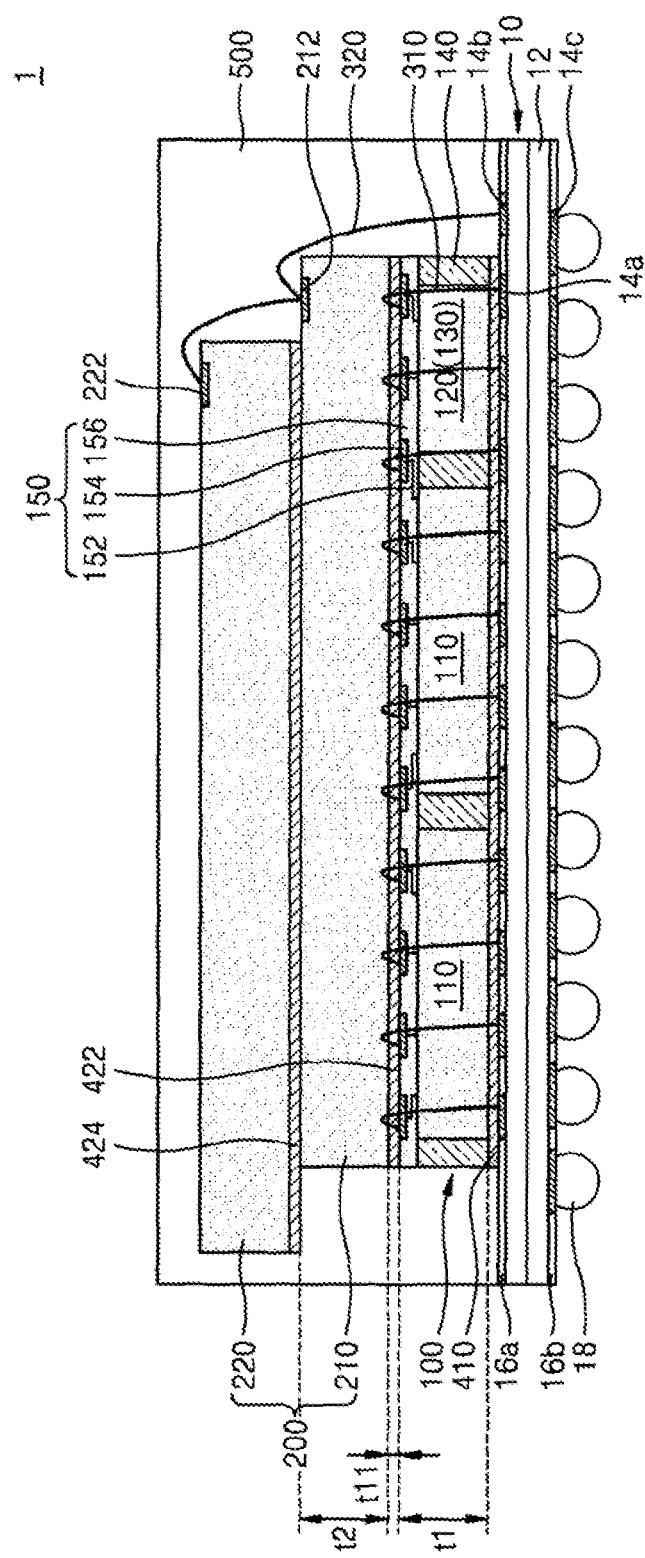
FIGS. 1A and 1B are a cross-sectional view and a plan layout of parts of a stacked semiconductor package according to an embodiment.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Figure 1B:
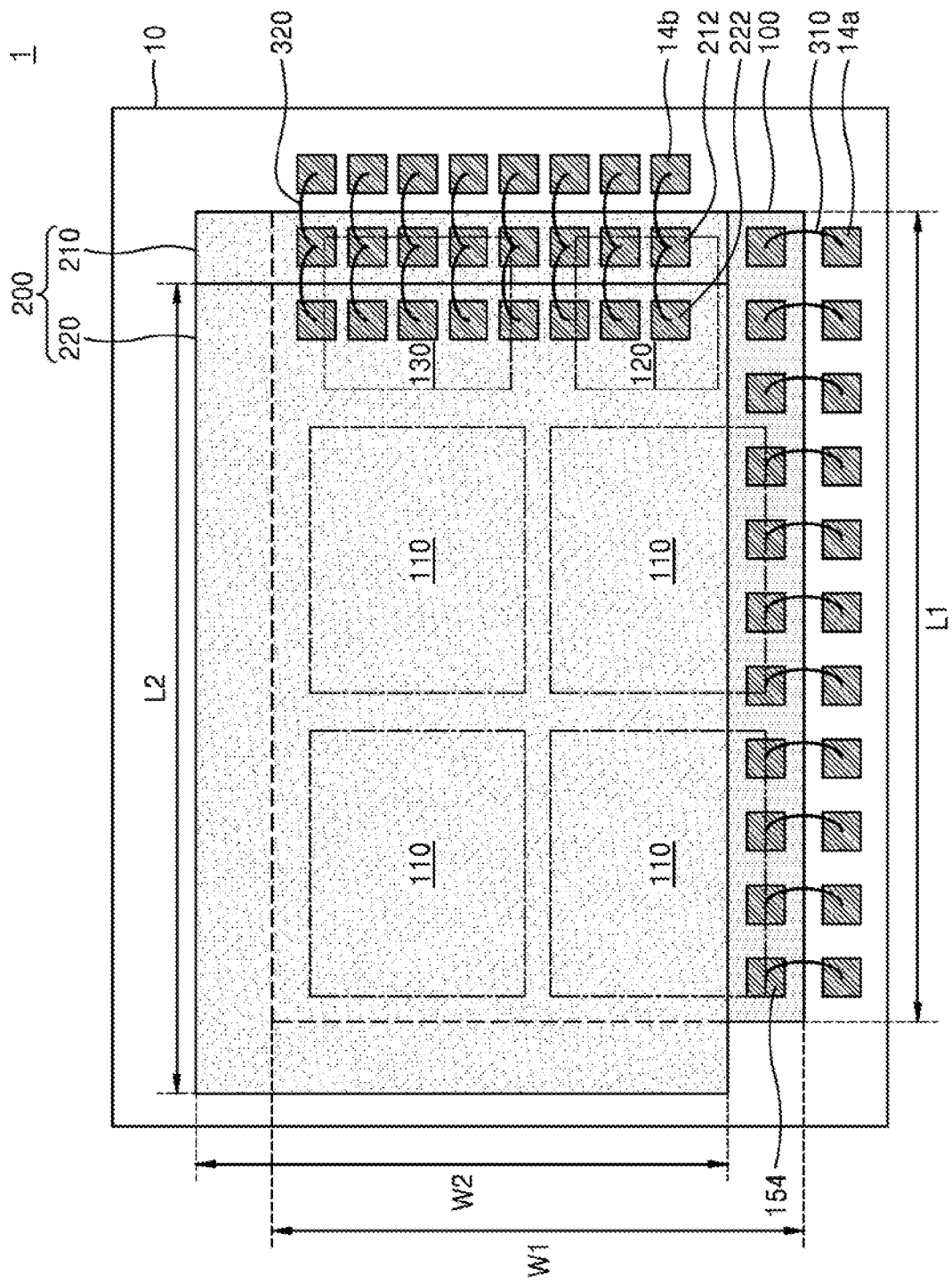

FIGS. 1A and 1B are a cross-sectional view and a plan layout of parts of a stacked semiconductor package 1 according to an embodiment.

Referring to FIGS. 1A and 1B, the stacked semiconductor package 1 may include a sub semiconductor package 100, which may be located on a base substrate layer 10 (also described as a base substrate, package substrate, or base package substrate) and have a plurality of sub semiconductor chips (e.g., first, second, and third sub semiconductor chips 110, 120, and 130) and at least one main semiconductor chip (e.g., described as one or more main semiconductor chips 200, or main semiconductor chip(s) 200) stacked on the sub semiconductor package 100. In different embodiments, each one of the sub semiconductor chips may be described as a "first semiconductor chip" such that the sub semiconductor package 100 may include a plurality of "first semiconductor chips," and each of the main semiconductor chips 200 may be described as a "second semiconductor chip." The terms "first" and "second" in this example can be interchanged, and are only used for naming purposes, and these terms may apply to the other embodiments described herein.

As used herein, a main semiconductor chip and a sub semiconductor chip may not refer to having a principal and subordinate relationship therebetween, or to one chip being on top or below another. Rather, a semiconductor chip having a relatively large area will be referred to as a main semiconductor chip, while a semiconductor chip having a relatively small area (e.g., as compared to the main semiconductor chip) will be referred to as a sub semiconductor chip. For example, the stacked semiconductor package 1 may include the main semiconductor chip(s) 200, which is a semiconductor chip or a plurality of semiconductor chips having the largest area among semiconductor chips included in the stacked semiconductor package 1, and the plurality of sub semiconductor chips 110, 120, and 130 having a smaller area than the main semiconductor chip(s) 200 (areas being viewed from a plan view).

The base substrate layer 10 may be, for example, a printed circuit board (PCB), a ceramic substrate, an interposer, or a redistribution layer. In some embodiments, the base substrate layer 10 may be a multi-layered PCB on which a plurality of base layers 12 are stacked. In some embodiments, each of the plurality of base layers 12 may include at least one material selected from the group consisting of a phenol resin, an epoxy resin, and polyimide. For example, each of the plurality of base layers 12 may include at least one material selected from the group consisting of Frame Retardant 4 (FR4), tetrafunctional epoxy, polyphenylene ether, epoxy/polyphenylene oxide, bismaleimide triazine (BT), Thermount, cyanate ester, polyimide, and a liquid crystal polymer.

A plurality of top connection pads (e.g., first and second top connection pads 14a and 14b) may be located on a top surface of the base substrate layer 10, and a plurality of bottom connection pads 14c may be located on a bottom surface of the base substrate layer 10. The various pads of a device or substrate described herein may be conductive terminals connected to internal wiring of the device or substrate respectively, and may transmit signals and/or supply voltages between an internal wiring and/or internal circuit of the device or substrate and an external source or to another device or substrate. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device or substrate and may generally have a planar surface area (often larger than a corresponding surface area of the internal wiring to which they are connected) to promote connection to a further terminal, such as a bump or solder ball, and/or an internal or external wiring.

Internal interconnections and a plurality of conductive vias may be formed in the base substrate layer 10 to connect the top connection pads 14a and 14b with the bottom connection pads 14c. The internal interconnections may be between the plurality of base layers 12, respectively, and the plurality of conductive vias may penetrate the plurality of base layers 12, respectively. In some embodiments, an interconnection pattern may be further located on at least one of the top surface and the bottom surface of the base substrate layer 10 and connect the top connection pads 14a and 14b and/or the bottom connection pads 14c with the conductive vias.

The top connection pads 14a and 14b, the bottom connection pad 14c, the internal interconnections, and/or the interconnection pattern may include, for example, electrolytically deposited (ED) copper foil, rolled-annealed (RA) copper foil, stainless steel foil, aluminum foil, ultra-thin copper foil, sputtered copper, and a copper alloy. The conductive vias may include, for example, copper, nickel, or beryllium copper.

A first solder resist layer 16a and a second solder resist layer 16b may be respectively formed on the top surface and the bottom surface of the base substrate layer 10. The first solder resist layer 16a may expose the top connection pads 14a and 14b and cover top surfaces of the plurality of base layers 12. The second solder resist layer 16b may expose the bottom connection pad 14c and cover bottom surfaces of the plurality of base layers 12. External connection terminals 18 may be adhered to the bottom connection pads 14c located on the bottom surface of the base substrate layer 10. The external connection terminals 18 may be, for example, solder balls or bumps. The external connection terminals 18 may electrically connect the stacked semiconductor package 1 with an external apparatus.

The first and second top connection pads 14a and 14b located on the top surface of the base substrate layer 10 may include a plurality of first top connection pads 14a connected to the sub semiconductor package 100 and a plurality of second top connection pads 14b connected to the main semiconductor chip(s) 200. In some embodiments, some of the top connection pads 14a and 14b may be commonly connected to the sub semiconductor package 100 and the main semiconductor chip(s) 200.

The plurality of first top connection pads 14a and the plurality of second top connection pads 14b may be respectively located adjacent to different sides of the top surface of the base substrate layer 10.

A semiconductor substrate included in the sub semiconductor chips 110, 120, and 130 and/or the main semiconductor chip(s) 200 may include, for example, silicon (Si). Alternatively, a semiconductor substrate included in the sub semiconductor chips 110, 120, and 130 and/or the main semiconductor chip(s) 200 may include a semiconductor element (e.g., germanium (Ge)) or a compound semiconductor, such as silicon carbide (SiC), gallium arsenide (GaAs), indium arsenide (InAs), and indium phosphide (InP). Alternatively, a semiconductor substrate included in the sub semiconductor chips 110, 120, and 130 and/or the main semiconductor chip(s) 200 may have a silicon-on-insulator (SOI) structure. For example, a semiconductor substrate included in the sub semiconductor chips 110, 120, and 130 and/or the main semiconductor chip(s) 200 may include a buried oxide (BOX) layer. A semiconductor substrate included in the sub semiconductor chips 110, 120, and 130 and/or the main semiconductor chip(s) 200 may include a conductive region, for example, a doped well. A semiconductor substrate included in the sub semiconductor chips 110, 120, and 130 and/or the main semiconductor chip(s) 200 may include one of various isolation structures, such as a shallow trench isolation (STI) structure. Different ones of the sub semiconductor chips 110, 120, 130, and main semiconductor chip(s) 200 can include semiconductor substrates that are formed of the same materials and structures, or may include semiconductor substrates that are formed of different materials and structures.

The sub semiconductor chips 110, 120, and 130 and/or the main semiconductor chip(s) 200 may each constitute a semiconductor device including various kinds of individual devices. The plurality of individual devices may include various microelectronic devices, for example, a metal-oxide-semiconductor field-effect transistor (MOSFET) (e.g., a complementary metal-oxide-semiconductor (CMOS) transistor), a system large-scale integration (LSI), an image sensor (e.g., a CMOS imaging sensor (CIS), a micro-electromechanical system (MEMS), an active device, and/or a passive device. The plurality of individual devices may be electrically connected to the conductive region of the semiconductor substrate included in each of the sub semiconductor chips 110, 120, and 130 and/or the main semiconductor chip(s) 200. Each semiconductor device may further include conductive interconnections or conductive plugs configured to electrically connect at least two of the plurality of individual devices or electrically connect the plurality of individual devices with the conductive region of the semiconductor substrate included in the first, second, and third sub semiconductor chips 110, 120, and 130 and/or the main semiconductor chip(s) 200. Also, each of the plurality of individual devices may be electrically isolated from other adjacent individual devices by an insulating film.

In some embodiments, the sub semiconductor package 100 may include at least one first sub semiconductor chip 110, the second sub semiconductor chip 120, and the third sub semiconductor chip 130. Although FIGS. 1A and 1B illustrate a case in which the sub semiconductor package 100 includes four first sub semiconductor chips 110, the inventive concept is not limited thereto. For example, the sub semiconductor package 100 may include one first sub semiconductor chip 110 or two or six first sub semiconductor chips 110.

The at least one first sub semiconductor chip 110 may be, for example, a volatile memory semiconductor chip, such as a dynamic random access memory (DRAM) semiconductor chip. However, the inventive concept is not limited thereto. In some embodiments, for example, the at least one first sub semiconductor chip 110 may be a high-bandwidth memory (HBM) DRAM semiconductor chip.

The second sub semiconductor chip 120 may be, for example, a controller semiconductor chip for the main semiconductor chip(s) 200. The second sub semiconductor chip 120 may provide an interface and a protocol between a host and the main semiconductor chip(s) 200. The second sub semiconductor chip 120 may provide a standard protocol, such as parallel advanced technology attachment (PATA), serial advanced technology attachment (SATA), small computer system interface (SCSI), or peripheral component interface-express (PCIe), to provide the interface between the main semiconductor chip(s) 200 and the host. Also, the second sub semiconductor chip 120 may perform a wear leveling operation, a garbage collection operation, a bad block management operation, and an error correcting code (ECC) operation to support the main semiconductor chip(s) 200.

The third sub semiconductor chip 130 may be, for example, an integrated passive device (IPD) or a dummy semiconductor chip. In some embodiments, a plurality of third sub semiconductor chips 130 may be provided. The plurality of third sub semiconductor chips 130 may include a plurality of IPDs and a plurality of dummy semiconductor chips. Alternatively, the plurality of third sub semiconductor chips 130 may include at least one IPD and at least one dummy semiconductor chip. The IPD may include a resistor and a capacitor provided on a semiconductor substrate. Optionally, the IPD may further include a diode and/or an inductor provided on the semiconductor substrate. For example, the IPD or dummy semiconductor chip may not function as a logic and/or memory device. In some embodiments, the sub semiconductor package 100 may not include the third sub semiconductor chip 130.

The sub semiconductor package 100 may include the first, second, and third sub semiconductor chips 110, 120, and 130, a sub mold layer 140 configured to surround the plurality of sub semiconductor chips 110, 120, and 130, and a redistribution structure 150 provided on active surfaces of the plurality of sub semiconductor chips 110, 120, and 130 and on the sub mold layer 140.

In the sub semiconductor package 100, the plurality of sub semiconductor chips 110, 120, and 130 may be spaced apart from one another (e.g., horizontally separated), and spaces between the sub semiconductor chips 110, 120, and 130 may be filled with the sub mold layer 140. The sub mold layer 140 may include, for example, an epoxy mold compound (EMC). In some embodiments, the sub mold layer 140 may expose a top surface and a bottom surface of each of the plurality of sub semiconductor chips 110, 120, and 130 and surround and/or cover only a side surface of each of the plurality of sub semiconductor chips 110, 120, and 130. In some embodiments, a top surface of the sub mold layer 140 facing the redistribution structure 150 may be coplanar with the active surface of each of the plurality of sub semiconductor chips 110, 120, and 130. In some embodiments, a bottom surface of the sub mold layer 140 facing away from the redistribution structure 150 may be coplanar with an inactive surface of each of the plurality of sub semiconductor chips 110, 120, and 130.

The redistribution structure 150 may be formed on the active surfaces of the plurality of sub semiconductor chips 110, 120, and 130 and a top surface of the sub mold layer 140. The redistribution structure 150 may include a redistribution conductive layer 152, a plurality of redistribution pads 154, and a redistribution insulating layer 156.

The redistribution conductive layer 152 may connect at least some of the plurality of sub semiconductor chips 110, 120, and 130 with the redistribution pads 154. For example, the redistribution conductive layer 152 may electrically connect sub semiconductor chips other than the dummy semiconductor chip, from among the plurality of sub semiconductor chips 110, 120, and 130, with the redistribution pads 154.

In some embodiments, the redistribution conductive layer 152 may include a redistribution pattern layer having at least one layer and a redistribution via layer having at least one layer connected to the redistribution pattern layer. The redistribution conductive layer 152 may include, for example, copper, nickel, or a copper alloy, such as beryllium copper.

The redistribution pads 154 may be electrically connected to at least some of the plurality of sub semiconductor chips 110, 120, and 130 through the redistribution conductive layer 152. The redistribution pads 154 may include, for example, copper or a copper alloy and may not be covered by the redistribution insulating layer 156 but are exposed to an outside of the sub semiconductor package 100. The redistribution pads 154 may be located on a portion of a top surface of the sub semiconductor package 100 adjacent to one side of the top surface of the sub semiconductor package 100.

At least some of the plurality of redistribution pads 154 or portions of at least some of the plurality of redistribution pads 154 may not overlap the plurality of sub semiconductor chips 110, 120, and 130 in a direction perpendicular to a main surface of the base substrate layer 10. For example, at least some of the plurality of redistribution pads 154 or portions of at least some of the plurality of redistribution pads 154 may overlap the mold layer 140 in the direction perpendicular to the main surface of the base substrate layer 10. Some of the redistribution pads 154, for example, may be formed over the mold layer 140 to vertically overlap with the mold layer 140 and not with any of the plurality of sub semiconductor chips 110, 120, or 130. Other of the redistribution pads 154 may be formed over a combination of the mold layer 140 and one of the plurality of sub semiconductor chips 110, 120, or 130 to vertically overlap both the mold layer 140 and one of the plurality of sub semiconductor chips 110, 120, or 130. Accordingly, the sub semiconductor package 100 may be a fan-out wafer-level package (FOWLP)-type semiconductor package.

The redistribution insulating layer 156 may be formed on the active surfaces of the sub semiconductor chips 110, 120, and 130 and on the sub mold layer 140, may cover the redistribution conductive layer 152, and may expose the redistribution pads 154. The redistribution insulating layer 156 may be a single layer or a multi-layered structure, for example, depending on a structure of the redistribution conductive layer 152. The redistribution insulating layer 156 may include, for example, oxide, nitride, or oxynitride. In some embodiments, the formation of the redistribution insulating layer 156 may include coating the active surfaces of the sub semiconductor chips 110, 120, and 130 and the sub mold layer 140 with a resin material (e.g., a photo imagable dielectric (PID) material) including epoxy or polyimide and curing the resin material including epoxy or polyimide or include adhering a build-up film, such as an ajinomoto build-up film (ABF), to the active surfaces of the sub semiconductor chips 110, 120, and 130 and the sub mold layer 140.

The sub semiconductor package 100 may be adhered to the top surface of the base substrate layer 10 such that the active surfaces of the plurality of sub semiconductor chips 110, 120, and 130 and the redistribution structure 150 face upward, namely, face away from the base substrate layer 10. The sub semiconductor package 100 may be adhered to the top surface of the base substrate layer 10, for example, by a first die bonding film 410.

The main semiconductor chip(s) 200 may be adhered to the top surface of the sub semiconductor package 100. For example, a plurality of main semiconductor chips 200 may be stacked in a staircase form. In one embodiment, the main semiconductor chip(s) 200 may each be a non-volatile memory chip. The main semiconductor chip(s) 200 may be, for example, a NAND flash memory, resistive random access memory (RRAM), magnetoresistive RAM (MRAM), phase-change RAM (PRAM), or ferroelectric RAM (FRAM). When there are a plurality of main semiconductor chips 200, each of the main semiconductor chips may be of the same type and/or size, and may be identical chips. Also, as shown in the various figures (see the various embodiments below), at least one main semiconductor chip may overhang another main semiconductor chip, and/or may overhang the sub semiconductor package, at least on one side.

Although FIGS. 1A and 1B illustrate a case in which two main semiconductor chips (e.g., first and second main semiconductor chips 210 and 220) are stacked in a staircase form, the inventive concept is not limited thereto. For example, at least three main semiconductor chips 200 may be stacked in a staircase form. The plurality of main semiconductor chips 210 and 220 may be stacked in a staircase form to expose a plurality of wire connection pads (e.g., first and second wire connection pads 212 and 222) formed on the active surfaces of the main semiconductor chips 210 and 220.

A lowermost main semiconductor chip (e.g., the first main semiconductor chip 210) of the plurality of main semiconductor chips 210 and 220 may be adhered to the top surface of the sub semiconductor package 100 by a second die bonding film 422. The first main semiconductor chip 210 may be adhered in a staircase form to the top surface of the sub semiconductor package 100 to expose the plurality of redistribution pads 154 of the sub semiconductor package 100. The second main semiconductor chip 220 may be adhered to a top surface of the first main semiconductor chip 210 by a third die bonding film 424.

In a direction toward the main surface of the base substrate layer 10, a direction traversed for which steps of a staircase structure formed by the sub semiconductor package 100 and the first main semiconductor chip 210 ascend may be different from a direction traversed for which steps of a staircase structure formed by the plurality of main semiconductor chips 210 and 220 ascend. In some embodiments, in the direction toward the main surface of the base substrate layer 10, the direction traversed for which the steps of the staircase structure formed by the sub semiconductor package 100 and the first main semiconductor chip 210 ascend may be perpendicular to the direction traversed for which the steps of the staircase structure formed by the plurality of main semiconductor chips 210 and 220 ascend. Thus, the steps of the staircase structure formed by the sub semiconductor package 100 and the first main semiconductor chip 210 may be climbed in a first direction, and the steps of the staircase structure formed by the plurality of main semiconductor chips 210 and 220 may be climbed in a second direction. The first direction may be perpendicular to the second direction.

In some embodiments, the plurality of redistribution pads 154 of the sub semiconductor package 100 do not overlap the plurality of main semiconductor chips 210 and 220 in a direction perpendicular to the main surface of the base substrate layer 10 (e.g., vertically).

The sub semiconductor package 100 may be electrically connected to the base substrate layer 10 by first electrical connection members 310 configured to connect the redistribution pads 154 with the first top connection pads 14a. The first electrical connection members 310 may be, for example, bonding wires.

The plurality of main semiconductor chips 210 and 220 may be electrically connected to the base substrate layer 10 by second electrical connection members 320 configured to connect the first and second wire connection pads 212 and 222 with the second top connection pads 14b. The second electrical connection members 320 may sequentially connect the second wire connection pads 222 of the second main semiconductor chip 220, the first wire connection pads 212 of the first main semiconductor chip 210, and the second top connection pads 14b of the PCB 10. The second electrical connection members 320 may be, for example, bonding wires.

A main mold layer 500 may be formed on the base substrate layer 10 and cover the sub semiconductor package 100, the main semiconductor chip(s) 200, and the first and second electrical connection members 310 and 320.

The sub semiconductor chips 110, 120, and 130 included in the stacked semiconductor package 1 may be surrounded by a double mold layer including the sub mold layer 140 and the main mold layer 500, and the main semiconductor chip(s) 200 may be surrounded by the main mold layer 500, which is a single mold layer.

The sub semiconductor package 100 may have a first thickness t1, a first length L1, and a first width W1. Each of the plurality of main semiconductor chips 210 and 220 may have a second thickness t2, a second length L2, and a second width W2. In some embodiments, the first length L1 may be equal to the second length L2, and the first width W1 may be equal to the second width W2. Accordingly, the sub semiconductor package 100 may have the same area as each of the plurality of main semiconductor chips 210 and 220.

In some embodiments, the first thickness t1 may be equal to the second thickness t2. Accordingly, the sub semiconductor package 100 may have the same volume as each of the plurality of main semiconductor chips 210 and 220.

In some embodiments, the first to third die bonding films 410, 422, and 424 may have substantially the same thickness, for example, a third thickness t11.

The sub semiconductor package 100 may be electrically connected to the base substrate layer 10 through the plurality of redistribution pads 154 included in the redistribution structure 150, and the sub semiconductor package 100 may have the same area as each of the plurality of main semiconductor chips 210 and 220. Thus, the sub semiconductor package 100 and the plurality of main semiconductor chips 210 and 220 may be all handled as semiconductor chips having the same area and may be stacked.

Accordingly, the stacked semiconductor package 1 and the method of manufacturing the same according to the present embodiments may not involve complicated connection paths and complicated stacking processes to form a single stacked semiconductor package including a plurality of semiconductor chips having different areas, for example, each of the plurality of sub semiconductor chips 110, 120, and 130 and the plurality of main semiconductor chips 210 and 220. It should be noted that as described herein, a semiconductor chip refers to a die having an integrated circuit formed thereon and should not be construed the same as a package. A package includes at least one semiconductor chip, a package substrate on which the at least one semiconductor chip is disposed, and a mold layer or encapsulant surrounding and/or covering at least part of the package substrate and the at least one semiconductor chip.

Specifically, the stacked semiconductor package 1 may be formed by using a simple method of manufacturing a stacked semiconductor package. The method may include adhering the sub semiconductor package 100 to a top surface of the base substrate layer 10, sequentially stacking a plurality of main semiconductor chips 210 and 220 on the sub semiconductor package 100, and forming the first and second electrical connection members 310 and 320 including bonding wires.

Furthermore, the plurality of sub semiconductor chips 110, 120, and 130, which are semiconductor chips having a relatively small area, may be included in the sub semiconductor chip 100 having the plurality of redistribution pads 154 located in a relatively simple arrangement. Thus, an increase in thickness of a stacked semiconductor package, which may occur when semiconductor chips having different areas are stacked in different connection paths, may be prevented. Accordingly, a stacked semiconductor package 1 having a relatively small thickness may be formed.

Accordingly, since the stacked semiconductor package 1 is easily formed, a process of manufacturing the stacked semiconductor package 1 may be simplified, reliability of the stacked semiconductor package 1 may improve, and a thickness of the stacked semiconductor package 1 may be reduced.

Figure 2A:
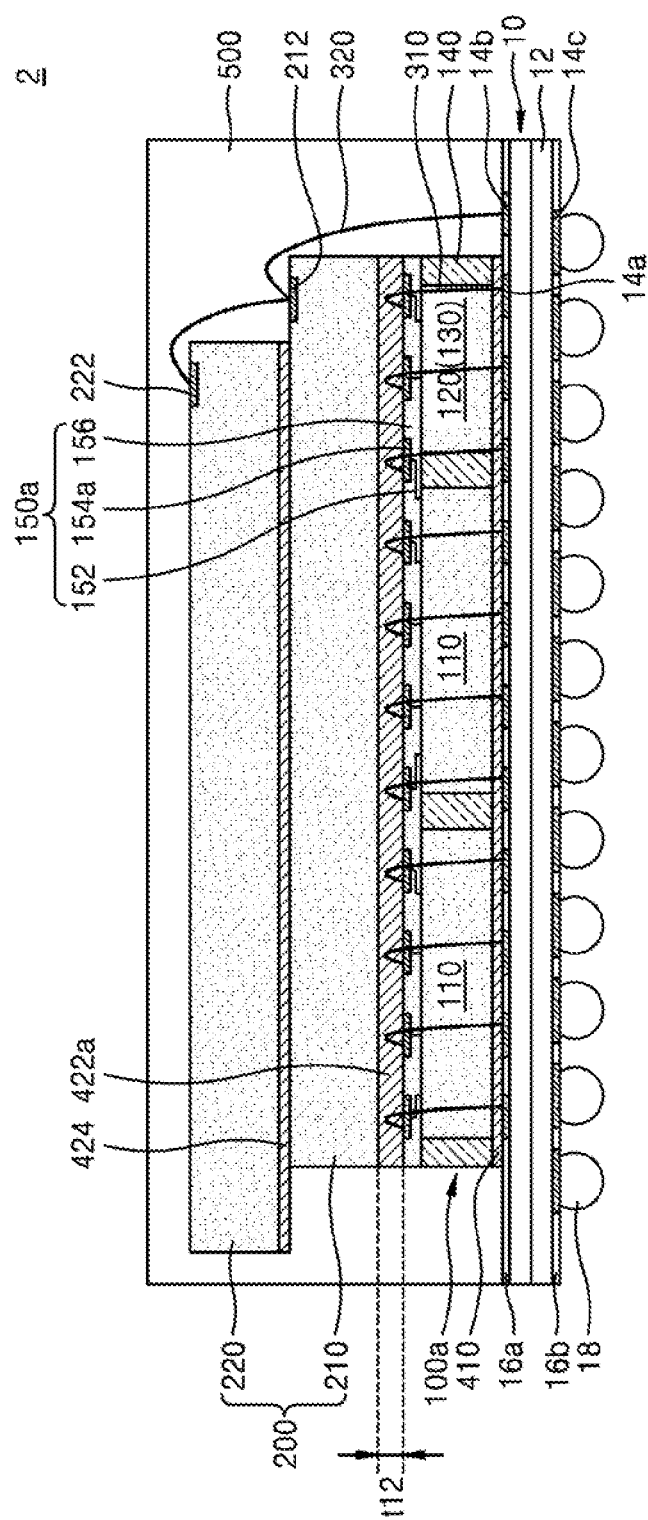
FIGS. 2A and 2B are a cross-sectional view and a plan layout of parts of a stacked semiconductor package according to an embodiment.
Figure 2B:
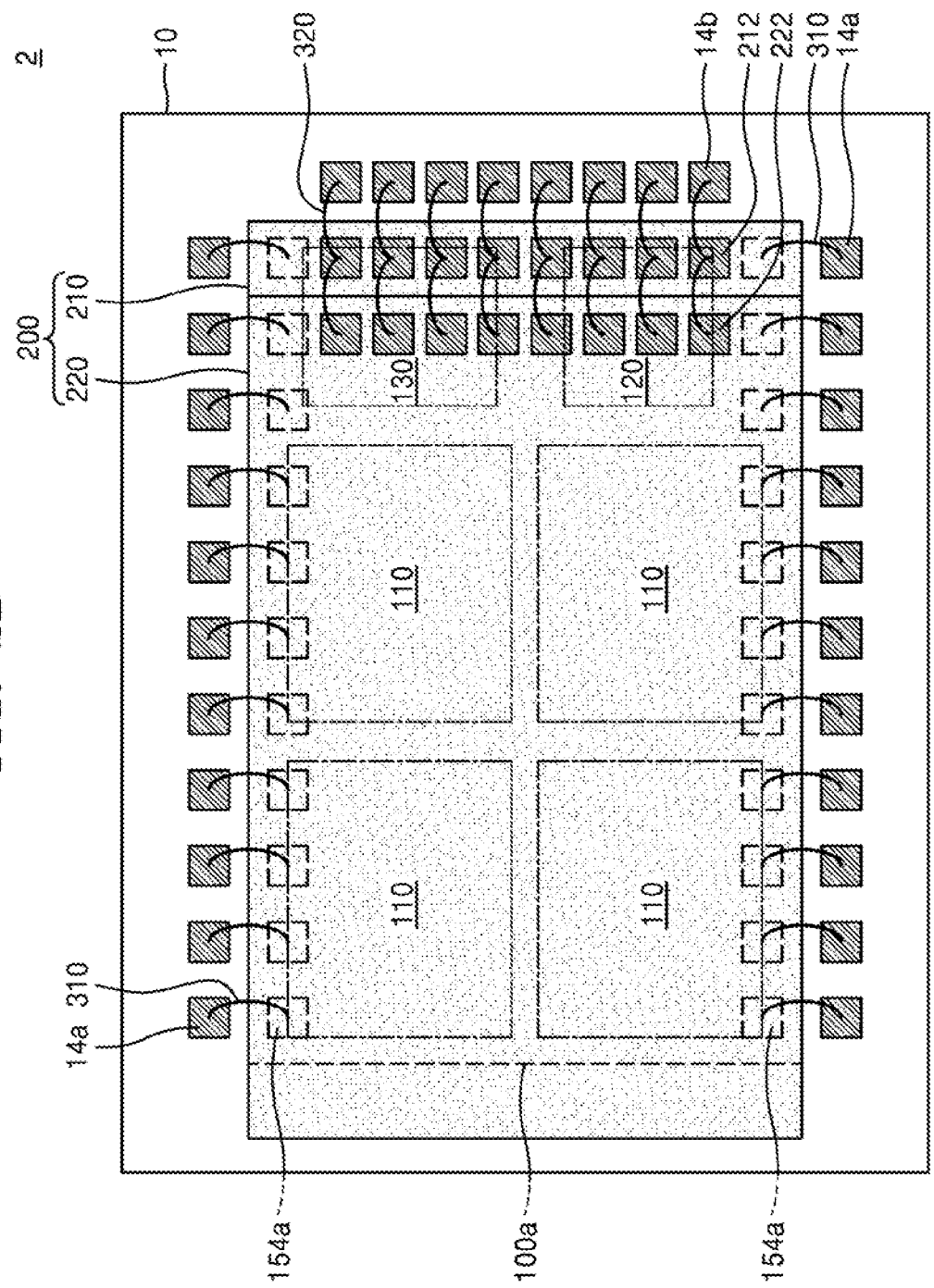

FIGS. 2A and 2B are a cross-sectional view and plan layout of parts of a stacked semiconductor package 2 according to an embodiment. The same descriptions of FIGS. 2A and 2B as in FIGS. 1A and 1B will be omitted.

Referring to FIGS. 2A and 2B, the stacked semiconductor package 2 may be located on a base substrate layer 10. The stacked semiconductor package 2 may include a sub semiconductor package 100a having a plurality of sub semiconductor chips (e.g., sub semiconductor chips 110, 120, and 130) and a plurality of main semiconductor chips (e.g., main semiconductor chips 210 and 220) stacked on the sub semiconductor package 100a.

A redistribution structure 150a included in the sub semiconductor package 100a may include a redistribution conductive layer 152, a plurality of redistribution pads 154a, and a redistribution insulating layer 156. The plurality of redistribution pads 154a may be respectively located on portions of the sub semiconductor package 100a adjacent to two opposite sides of a top surface of the sub semiconductor package 100a.

The sub semiconductor package 100a may be adhered to a top surface of the base substrate layer 10 by a first die bonding film 410. Subsequently, first electrical connection members 310 may be formed to connect the redistribution pads 154a of the sub semiconductor package 100a with a plurality of first top connection pads 14a of the base substrate layer 10. The plurality of first top connection pads 14a may correspond to the plurality of redistribution pads 154a of the sub semiconductor package 100a and be respectively located on portions of a top surface of the base substrate layer 10 adjacent to two side surfaces of the sub semiconductor package 100a.

A plurality of main semiconductor chips 200 may be adhered to a top surface of the sub semiconductor package 100a. The plurality of main semiconductor chips 200 may be stacked in a staircase form.

A lowermost main semiconductor chip (e.g., the first main semiconductor chip 210) of the plurality of main semiconductor chips 210 and 220 may be adhered to the top surface of the sub semiconductor package 100a by a second die bonding film 422a. The first main semiconductor chip 210 may be adhered to the top surface of the sub semiconductor package 100a and overlap the sub semiconductor package 100a in a direction perpendicular to a main surface of the base substrate layer 10. Thus, the second die bonding film 422a may cover the entire top surface of the sub semiconductor package 100a, such that outer edges of the sub semiconductor package 100a vertically align with outer edges of the first main semiconductor chip 210. Accordingly, the second die bonding film 422a may cover the redistribution pads 154a and bury portions of the first electrical connection members 310 including bonding wires.

The second main semiconductor chip 220 may be adhered to a top surface of the first main semiconductor chip 210 by a third die bonding film 424. The second main semiconductor chip 220 may be stacked on the first main semiconductor chip 210 and form a staircase along with the first main semiconductor chip 210 to expose a plurality of first wire connection pads 212 formed on the active surface of the first main semiconductor chip 210.

The second die bonding film 422 included in the stacked semiconductor package 1 shown in FIGS. 1A and 1B may have the third thickness t11, and the second die bonding film 422a included in the stacked semiconductor package 2 shown in FIGS. 2A and 2B may have a fourth thickness t12, which is greater than the third thickness t11. Also, the first die bonding film 410 and the third bonding film 424 included in the stacked semiconductor package 2 may have the third thickness t11, which is less than the fourth thickness t12. Accordingly, the second die bonding film 422a may be thicker than the first die bonding film 410 and the third die bonding film 424.

In the stacked semiconductor package 1 shown in FIGS. 1A and 1B, a plurality of redistribution pads 154 of the sub semiconductor package 100 may be located on a portion of the sub semiconductor package 100 adjacent to one side of a top surface of the sub semiconductor package 100 so that the plurality of redistribution pads 154 are exposed by the second die bonding film 422 and the first main semiconductor chip 210.

By comparison, in the stacked semiconductor package 2 shown in FIGS. 2A and 2B, although the plurality of redistribution pads 154a of the sub semiconductor package 100a are covered by the second die bonding film 422a and the first main semiconductor chip 210, the second die bonding film 422a may have the fourth thickness t12, which is a relatively large thickness. Thus, the plurality of redistribution pads 154a may be respectively located on the portions of the sub semiconductor package 100a adjacent to two opposite sides of the top surface of the sub semiconductor package 100a.

Although the stacked semiconductor package 2 has a greater thickness than the stacked semiconductor package 1 shown in FIGS. 1A and 1B by as much as a difference between the fourth thickness t12 and the third thickness t11, the sub semiconductor package 100a included in the stacked semiconductor package 2 may have a larger number of redistribution pads 154a than in the stacked semiconductor package 1. Accordingly, the stacked semiconductor package 2 may process a mass signal at a high speed.

Figure 3A:
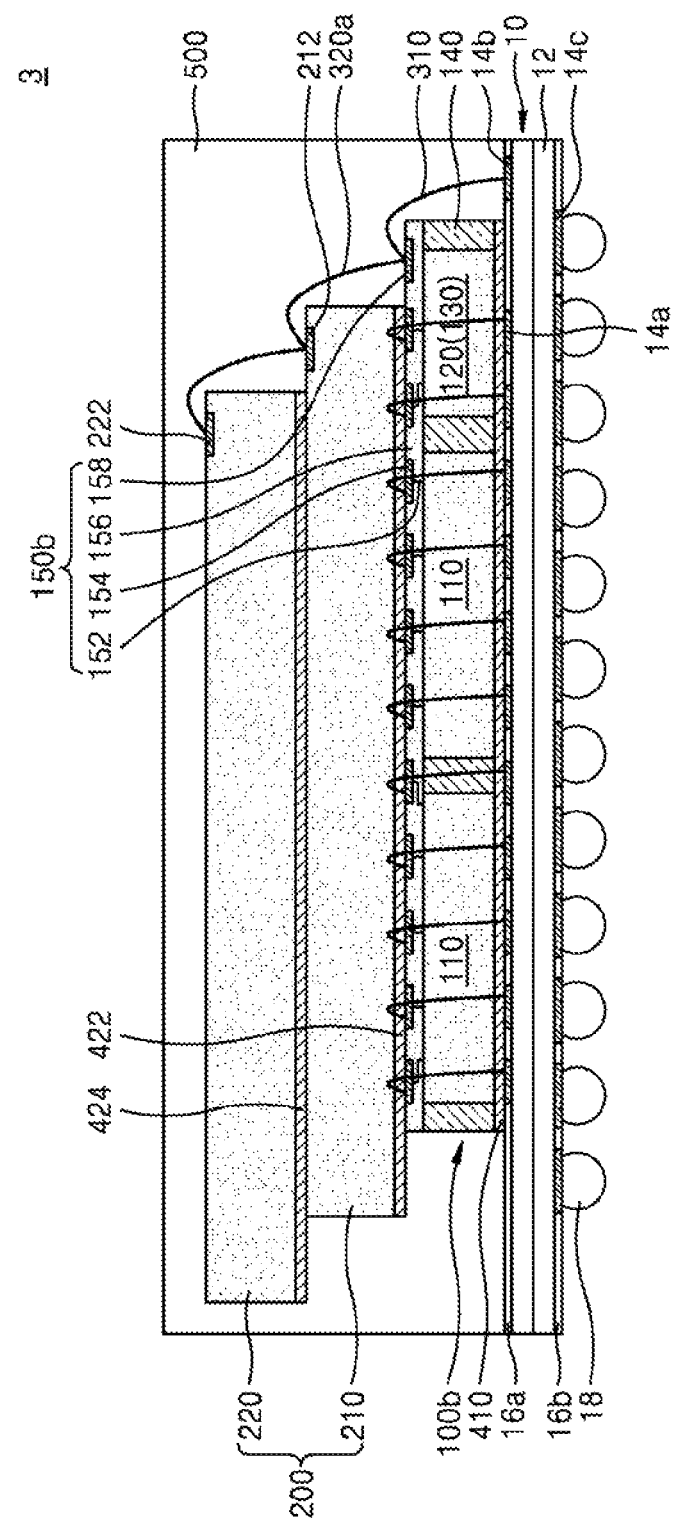
FIGS. 3A and 3B are a cross-sectional view and a plan layout of parts of a stacked semiconductor package according to an embodiment.
Figure 3B:
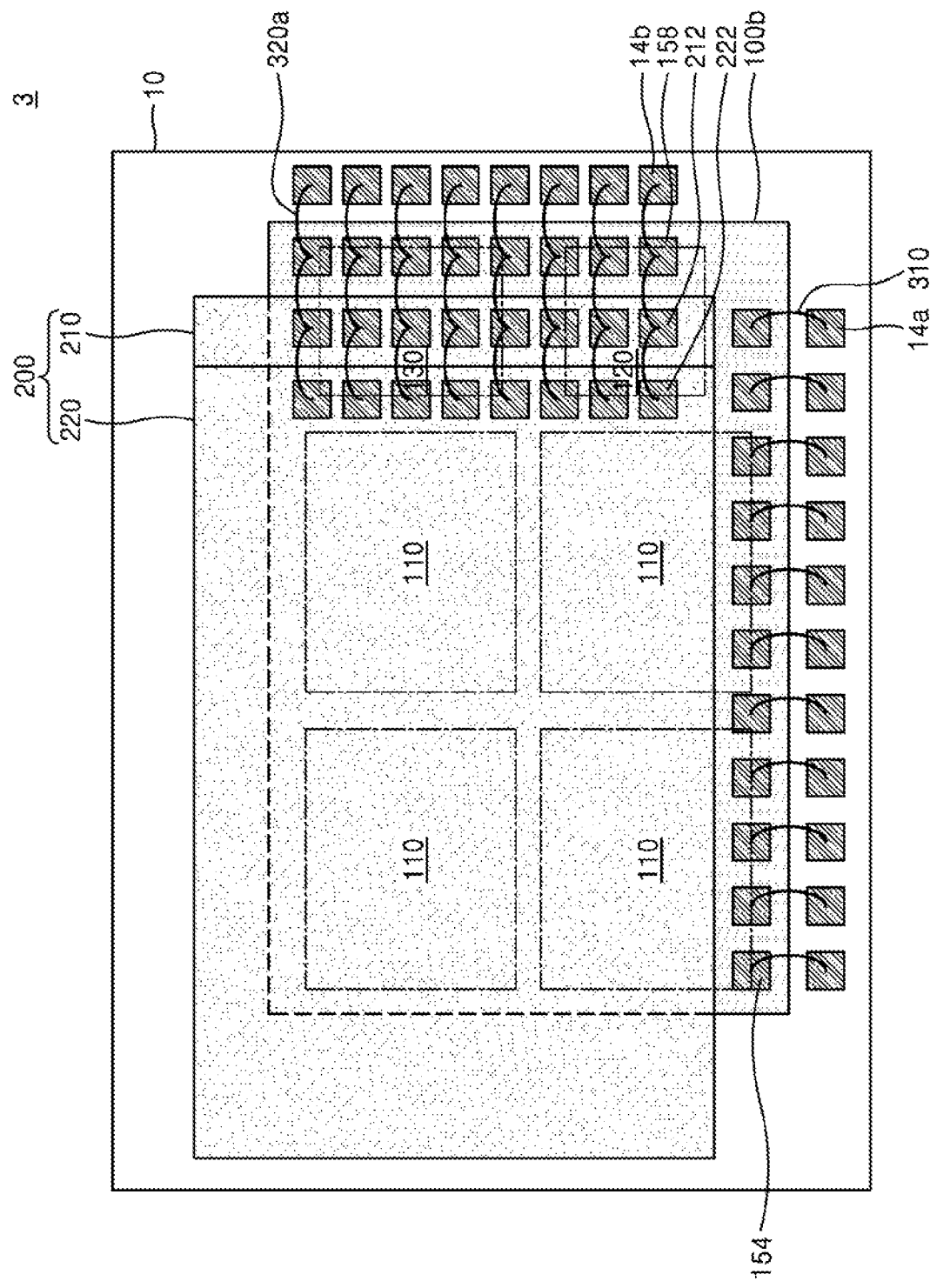

FIGS. 3A and 3B are a cross-sectional view and a plan layout of parts of a stacked semiconductor package 3 according to an embodiment. The same descriptions of FIGS. 3A and 3B as in FIGS. 1A to 2B will be omitted.

Referring to FIGS. 3A and 3B, the stacked semiconductor package 3 may include a sub semiconductor package 100b, which is located on a base substrate layer 10 and has a plurality of sub semiconductor chips (e.g., sub semiconductor chips 110, 120, and 130) and a plurality of main semiconductor chips (e.g., first and second main semiconductor chips 210 and 220) stacked on the sub semiconductor package 100b.

In a direction toward a main surface of the base substrate layer 10, a direction in which steps of a staircase structure formed by the sub semiconductor package 100b and the first main semiconductor chip 210 ascend may be different from a direction in which steps of a staircase structure formed by the first and second main semiconductor chips 210 and 220 ascend. In some embodiments, in the direction toward the main surface of the base substrate layer 10, the direction in which the steps of the staircase structure formed by the sub semiconductor package 100b and the first main semiconductor chip 210 ascend may be a direction that may form an acute angle with a direction of sides of top surfaces of the sub semiconductor package 100b and the first main semiconductor chip 210.

Accordingly, a portion of a top surface of the sub semiconductor package 100b adjacent to two sides abutting on one corner of the top surface of the sub semiconductor package 100b may be exposed by the plurality of main semiconductor chips 210 and 220.

A redistribution structure 150b may include a redistribution conductive layer 152, a plurality of redistribution pads 154, a redistribution insulating layer 156, and a plurality of dummy pads 158. The plurality of dummy pads 158 may not be electrically connected to circuitry of the plurality of sub semiconductor chips 110, 120, and 130 included in the sub semiconductor package 100b but may be electrically floated in the redistribution structure 150b. Thus, these dummy pads 158 may be referred to as floating pads, as they are floating with respect to internal circuitry of any of the sub semiconductor chips 110, 120, and 130 of the sub semiconductor package 100b.

Of a portion of a top surface of the sub semiconductor package 100b, which is exposed by the plurality of main semiconductor chips 210 and 220, the plurality of redistribution pads 154 may be formed on a portion of the exposed portion adjacent to one side of the top surface of the sub semiconductor package 100b, and the plurality of dummy pads 158 may be formed on a portion of the exposed portion adjacent to another side of the top surface of the sub semiconductor package 100b. Specifically, the plurality of dummy pads 158 may be formed on a portion of the top surface of the sub semiconductor package 100b adjacent to one side of the sub semiconductor package 100 in a direction in which the steps of the staircase structure formed by the plurality of main semiconductor chips 210 and 220 descend. The plurality of redistribution pads 154 may be formed on a portion of the top surface of the sub semiconductor package 100b adjacent to one side of the sub semiconductor package 100b in a different direction from the direction in which the steps of the staircase structure formed by the plurality of main semiconductor chips 210 and 220 descend.

Second electrical connection members 320a configured to connect the plurality of main semiconductor chips 210 and 220 with the base substrate layer 10 may pass through the dummy pads 158. The second electrical connection members 320a may sequentially connect the second wire connection pads 222 of the second main semiconductor chip 220, the first wire connection pads 212 of the first main semiconductor chip 210, the dummy pads 158 of the sub semiconductor package 100b, and the second top connection pads 14b of the base substrate layer 10.

As described with reference to FIG. 1A, a thickness of the sub semiconductor package 100b may be equal to a thickness of each of the plurality of main semiconductor chips 210 and 220. Accordingly, a distance between the second wire connection pads 222 of the second main semiconductor chip 220 and the first wire connection pads 212 of the first main semiconductor chip 210, a distance between the first wire connection pads 212 of the first main semiconductor chip 210 and the dummy pads 158 of the sub semiconductor package 100b, and a distance between the dummy pads 158 of the sub semiconductor package 100a and the second top connection pads 14b of the base substrate layer 10, in a vertical direction, may be substantially equal to one another.

Thus, paths of the second electrical connection members 320a including bonding wires, which are configured to connect the second wire connection pads 222, the first wire connection pads 212, the dummy pads 158, and the second top connection pads 14b, may be easily formed and simplified. As a result, reliability of electrical connection between the plurality of main semiconductor chips 210 and 220 and the base substrate layer 10 may improve.

Figure 4A:
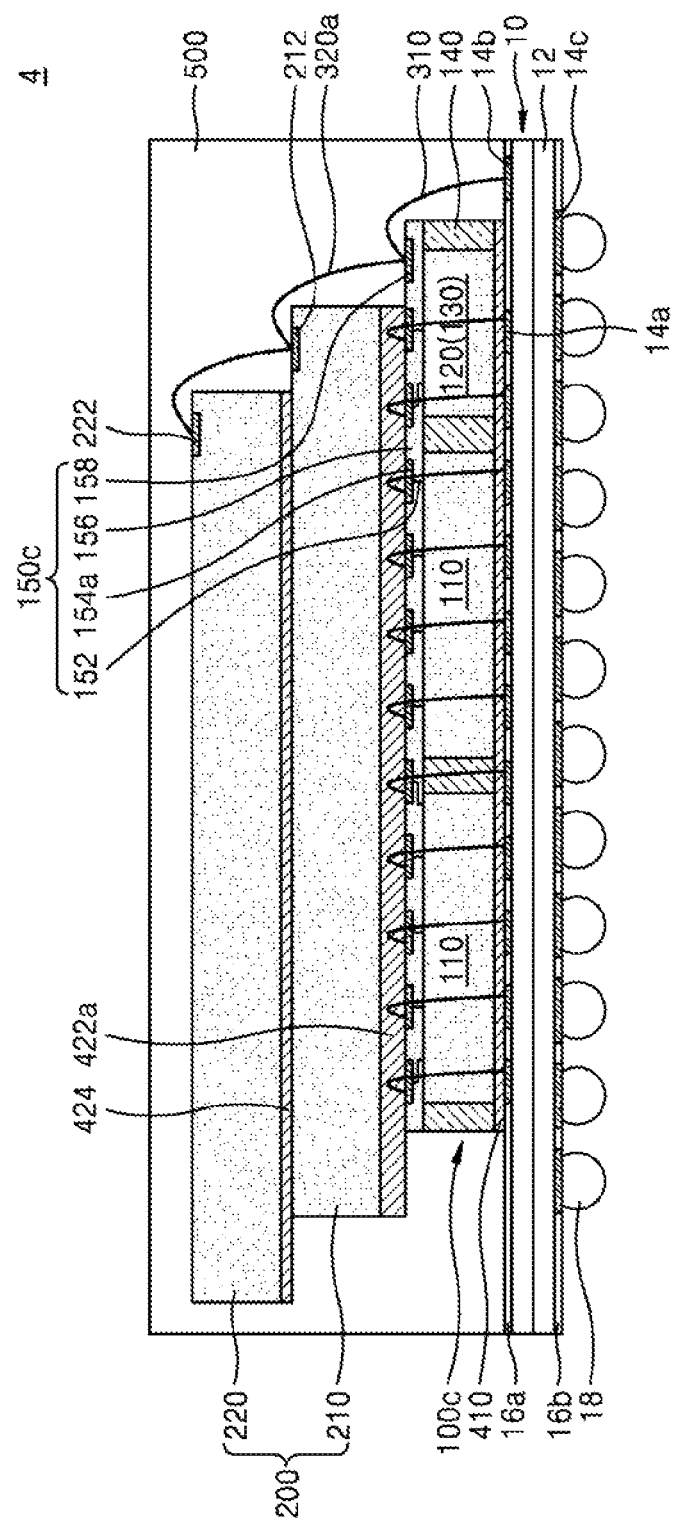
FIGS. 4A and 4B are a cross-sectional view and a plan layout of parts of a stacked semiconductor package according to an embodiment.
Figure 4B:
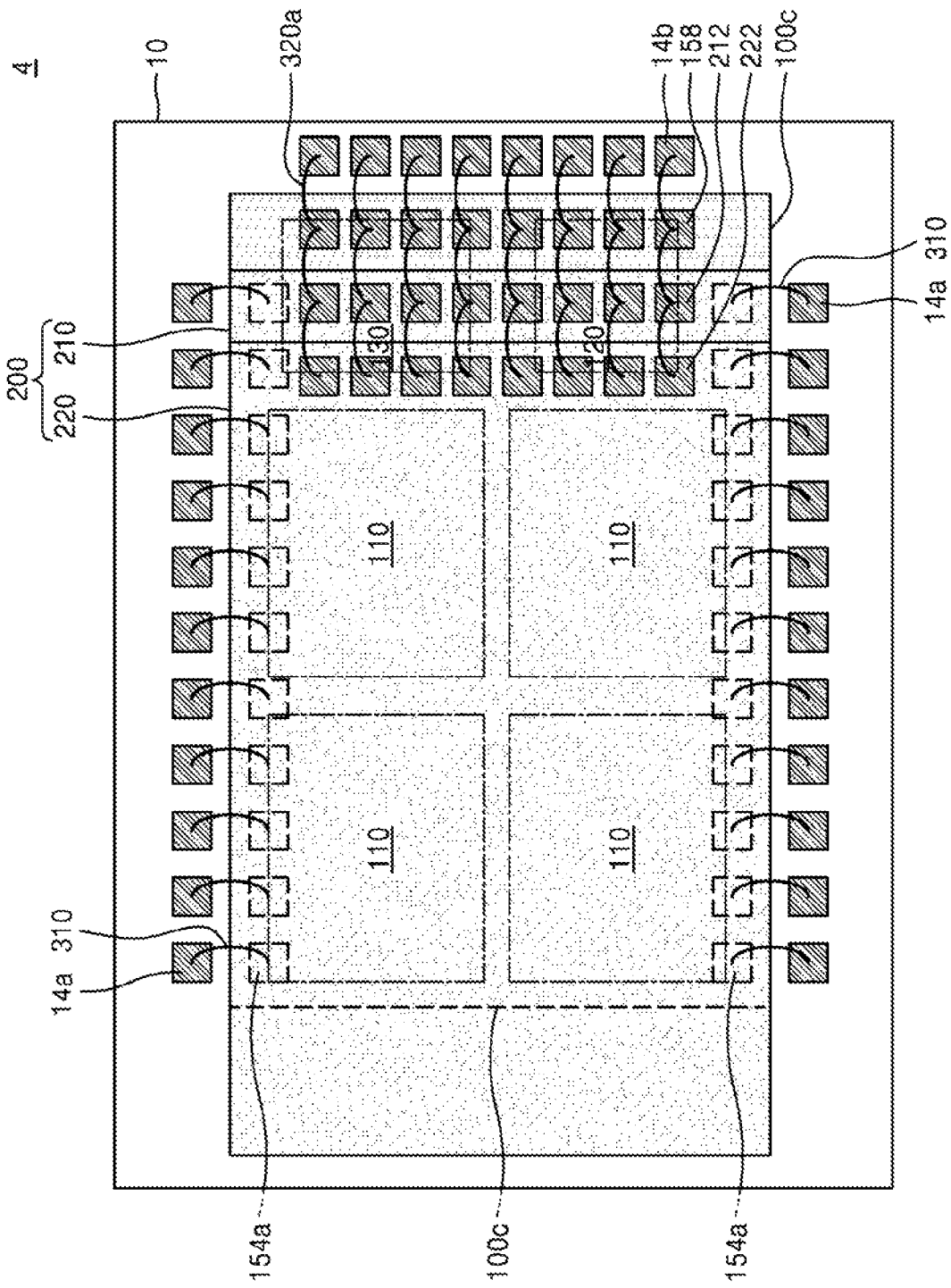

FIGS. 4A and 4B are a cross-sectional view and a plan layout of parts of a stacked semiconductor package 4 according to an embodiment. The same descriptions of FIGS. 4A and 4B as in FIGS. 1A to 3B will be omitted.

Referring to FIGS. 4A and 4B, the stacked semiconductor package 4 may include a sub semiconductor package 100c, which is located on a base substrate layer 10 and has a plurality of sub semiconductor chips 110, 120, and 130, and a plurality of main semiconductor chips (e.g., main semiconductor chips 210 and 220) stacked on the sub semiconductor package 100c. The sub semiconductor package 100c and each of the plurality of main semiconductor chips 210 and 220 may have a staircase structure in which steps ascend in the same direction.

A redistribution structure 150c included in the sub semiconductor package 100c may include a redistribution conductive layer 152, a plurality of redistribution pads 154a, a redistribution layer 156, and dummy pads 158. The plurality of redistribution pads 154a may be respectively located on portions of a top surface of the base substrate layer 10 adjacent to two opposite sides of a top surface of the sub semiconductor package 100c. The plurality of dummy pads 158 may be located on a portion of the top surface of the sub semiconductor package 100c adjacent to another side of the top surface of the sub semiconductor package 100c.

Like the sub semiconductor package 100a shown in FIGS. 2A and 2B, the sub semiconductor package 100c may be electrically connected to the base substrate layer 10 by a plurality of first electrical connection members 310 configured to connect the redistribution pads 154a of the sub semiconductor package 100c with first top connection pads 14a of the base substrate layer 10. A second die bonding film 422a may cover the plurality of redistribution pads 154a and bury respective portions of the first electrical connection members 310, which are connected to the plurality of redistribution pads 154a and include bonding wires. In some embodiments, although not shown, some of the plurality of redistribution pads 154a may be located adjacent to the dummy pads 158 and may not covered by the second die bonding film 422a.

As shown in FIGS. 3A and 3B, second electrical connection members 320a configured to electrically connect main semiconductor chips 200 with the base substrate layer 10 may pass through the dummy pads 158 of the sub semiconductor package 100c. The second electrical connection members 320a may sequentially connect second wire connection pads 222 of the second main semiconductor chip 220, first wire connection pads 212 of the first main semiconductor chip 210, the dummy pads 158 of the sub semiconductor package 100c, and second top connection pads 14b of the base substrate layer 10.

Figure 5A:
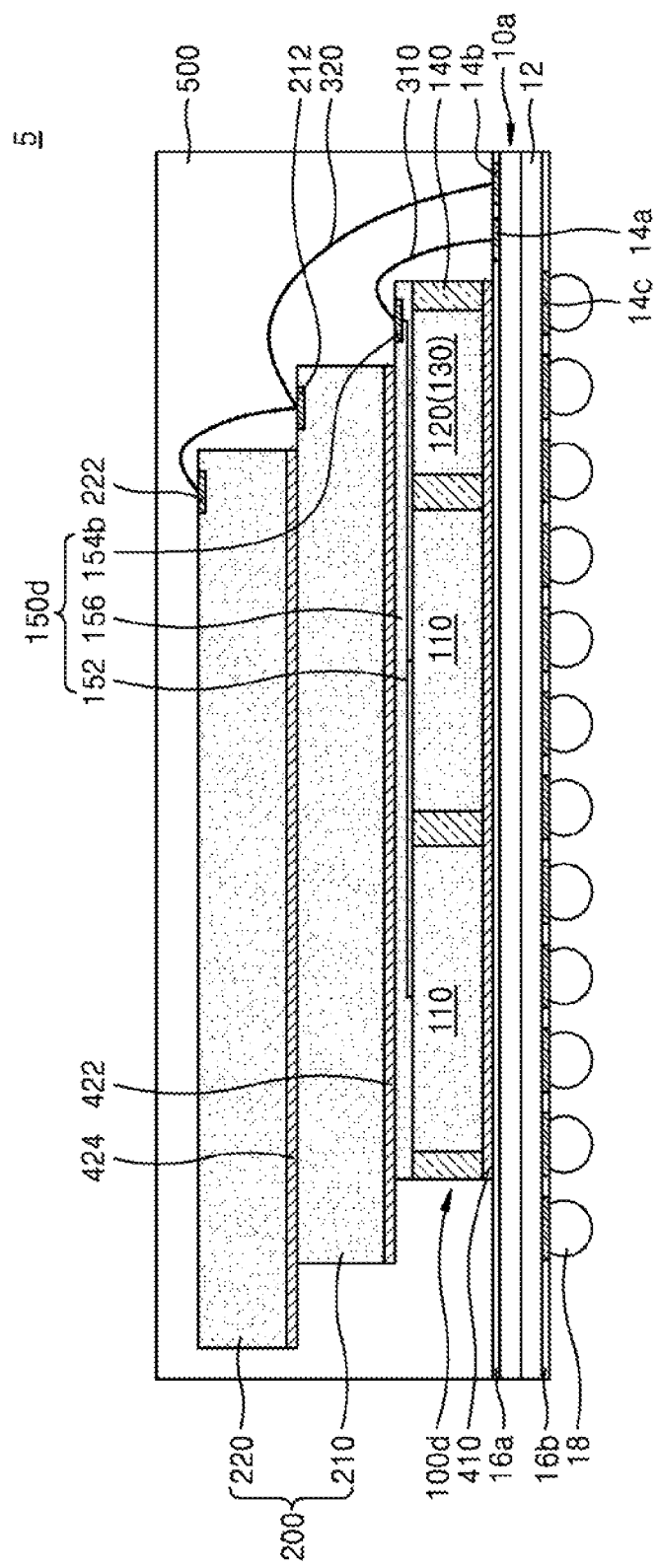
FIGS. 5A and 5B are a cross-sectional view and a plan layout of parts of a stacked semiconductor package according to an embodiment.
Figure 5B:
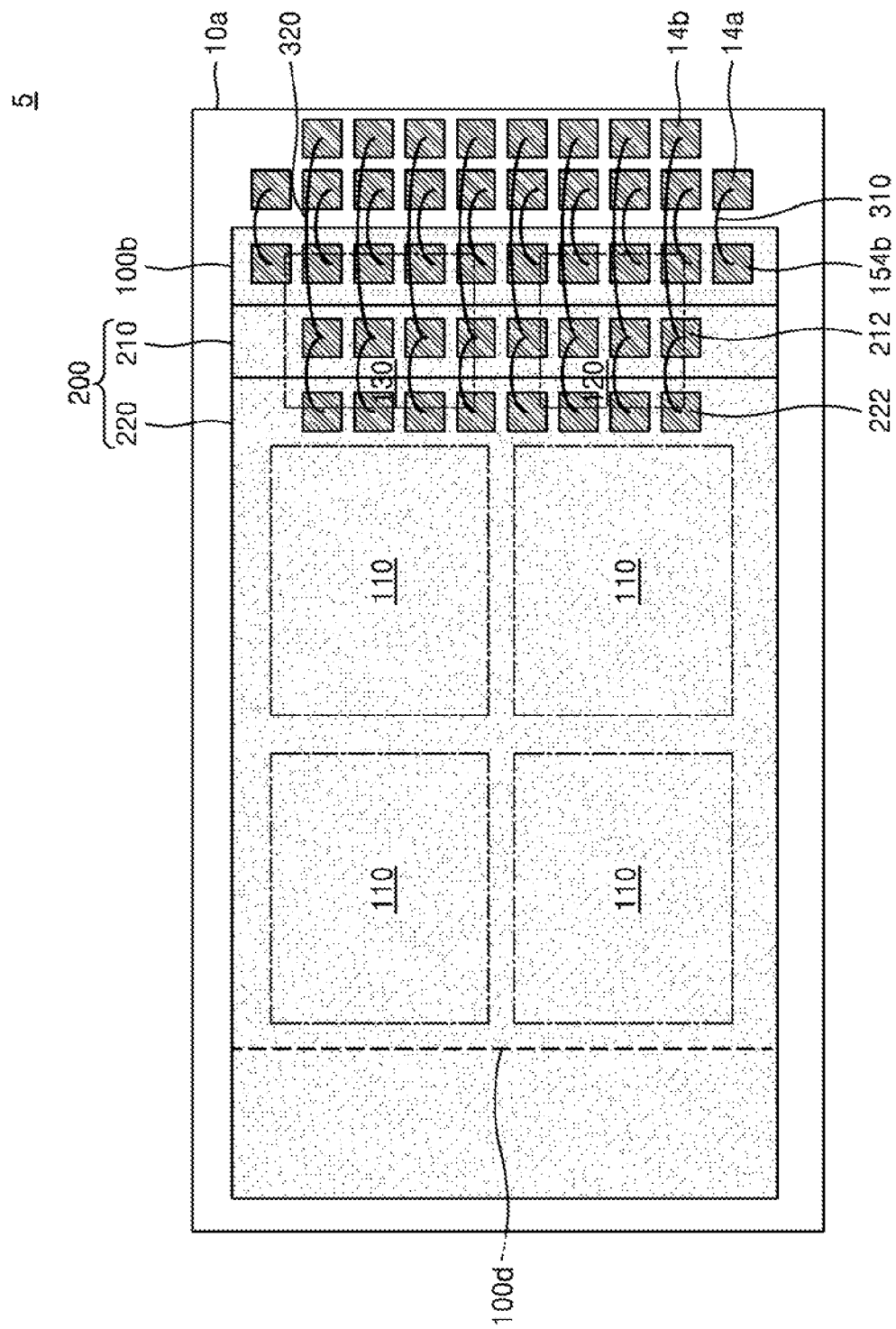

FIGS. 5A and 5B are a cross-sectional view and a plan layout of parts of a stacked semiconductor package 5 according to an embodiment. The same descriptions of FIGS. 5A and 5B as in FIGS. 1A to 4B will be omitted.

Referring to FIGS. 5A and 5B, the stacked semiconductor package 5 may include a sub semiconductor package 100d, which is located on a base substrate layer 10a and has a plurality of sub semiconductor chips (e.g., sub semiconductor chips 110, 120, and 130), and a plurality of main semiconductor chips (e.g., main semiconductor chips 210 and 220) stacked on the sub semiconductor package 100d. The sub semiconductor package 100d and the plurality of main semiconductor chips 210 and 220 may have a staircase structure in which steps ascend in the same direction.

A plurality of second top connection pads 14b of the base substrate layer 10a may be located adjacent to one side of a top surface of the base substrate layer 10a. A plurality of first top connection pads 14a may be located on the top surface of the base substrate layer 10a between the plurality of second top connection pads 14b and one side surface of the sub semiconductor package 100d.

A redistribution structure 150d of the sub semiconductor package 100d may include a redistribution conductive layer 152, a plurality of redistribution pads 154b, and a redistribution insulating layer 156. The plurality of main semiconductor chips 210 and 220 may be stacked on the sub semiconductor package 100d in a staircase form to expose the plurality of redistribution pads 154b.

In the stacked semiconductor package 5, the plurality of redistribution pads 154b of the sub semiconductor package 100d may be located on a portion of a top surface of the sub semiconductor package 100d, and a plurality of wire connection pads 212 and 222 of the plurality of main semiconductor chips 210 and 220 may be located on respective portions of the plurality of main semiconductor chips 210 and 220. In this case, the portion of the top surface of the sub semiconductor package 100d and the respective portions of the plurality of main semiconductor chips 210 and 220 in which the plurality of redistribution pads 154b and the plurality of wire connection pads 212 and 222 are located may be adjacent to the same side of the base substrate layer 10a.

The sub semiconductor package 100 may be electrically connected to the base substrate layer 10a by first electrical connection members 310 configured to connect the redistribution pads 154b with the first top connection pads 14a. The plurality of main semiconductor chips 210 and 220 may be electrically connected to the PCB 10a by second electrical connection members 320 configured to connect the wire connection pads 212 and 222 with the second top connection pads 14b. The second electrical connection members 320 may sequentially connect the second wire connection pads 222 of the second main semiconductor chip 220, the first wire connection pads 212 of the first main semiconductor chip 210, and the second top connection pads 14b of the base substrate layer 10a.

In the stacked semiconductor package 5, the first electrical connection members 310 and the second electrical connection members 320 may be formed adjacent to the same side of the base substrate layer 10a. Thus, an area required to form the first electrical connection members 310 and the electrical connection members 320 in the stacked semiconductor package 5 may be minimized. As a result, an area of the stacked semiconductor package 5 may be reduced.

Figure 6A:
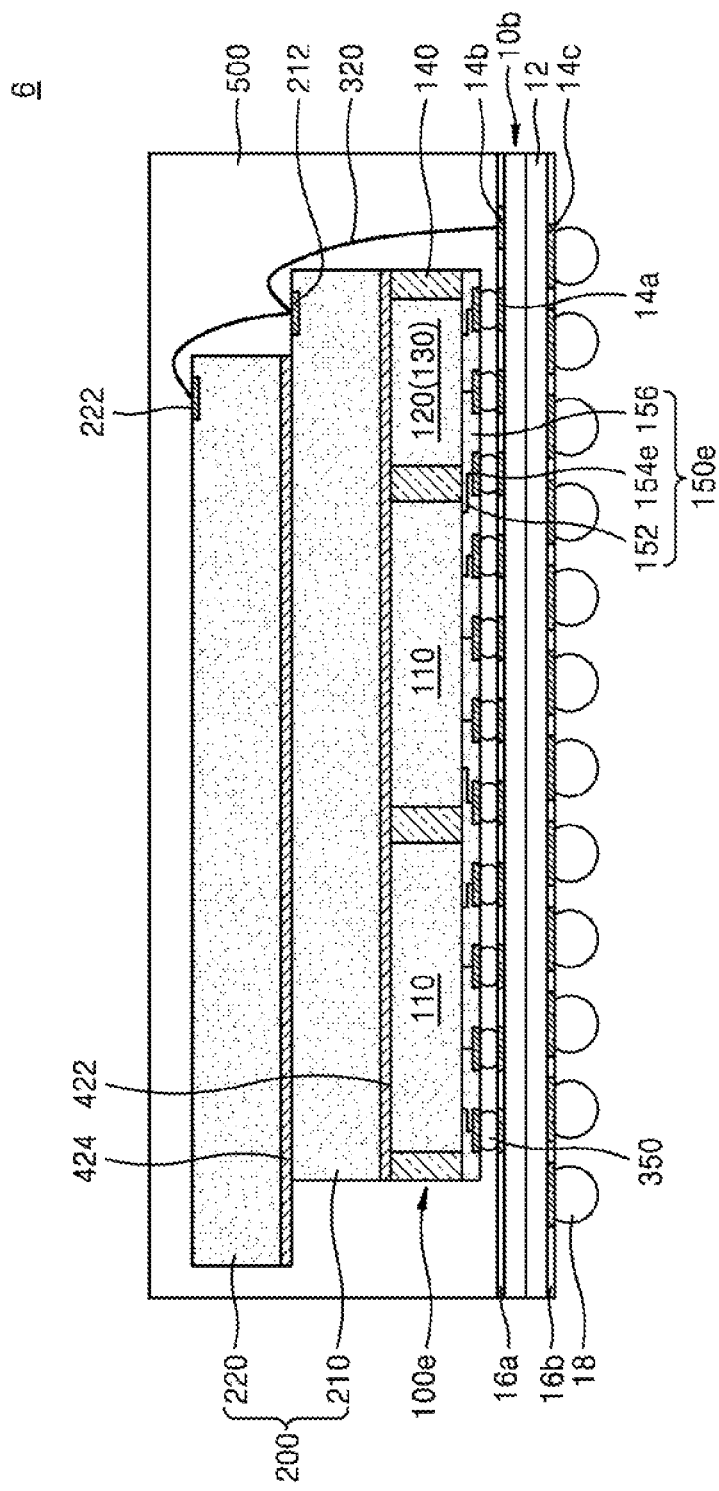
FIGS. 6A and 6B are a cross-sectional view and a plan layout of parts of a stacked semiconductor package according to an embodiment.
Figure 6B:
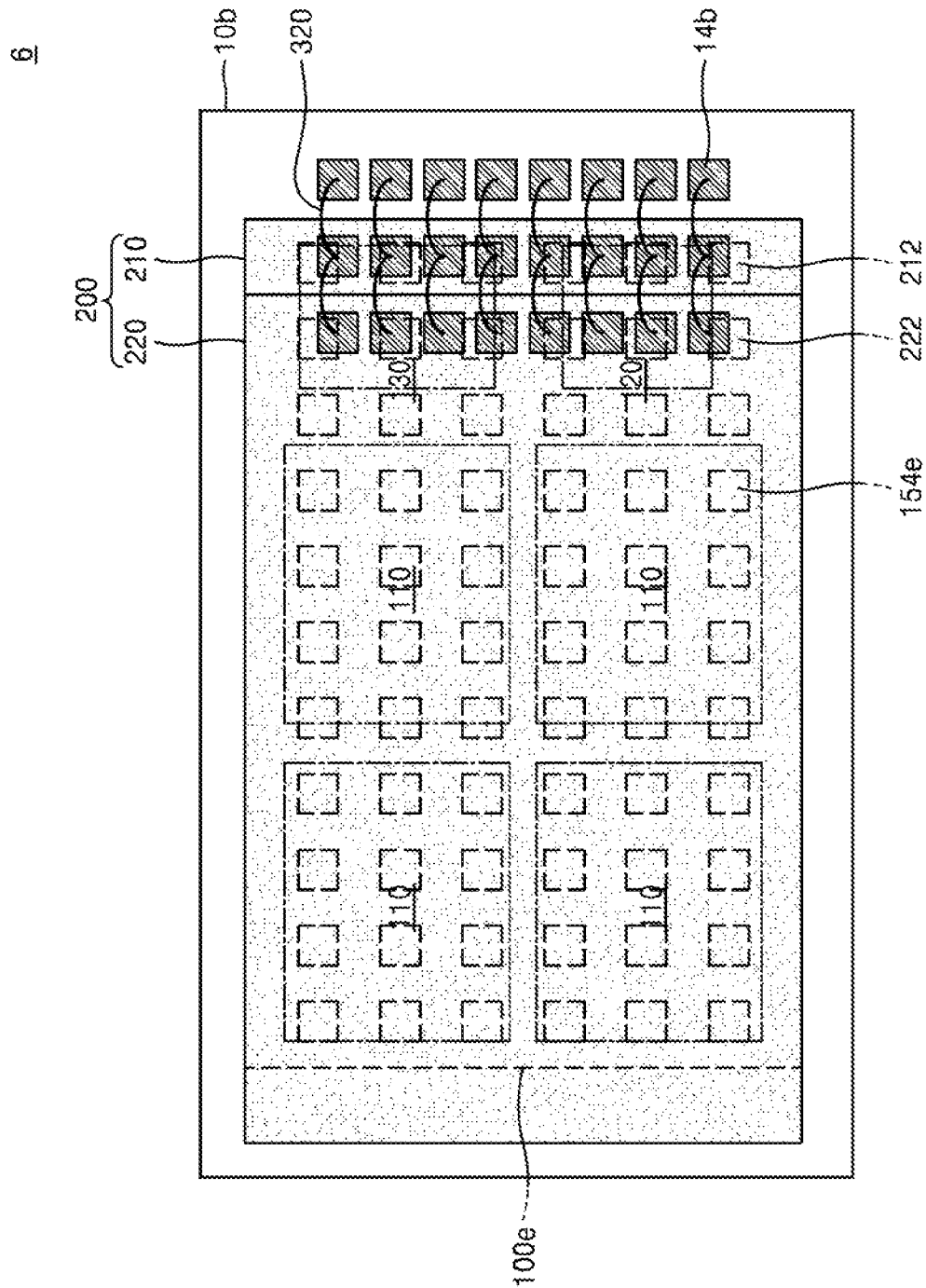

FIGS. 6A and 6B are a cross-sectional view and a plan layout of parts of a stacked semiconductor package 6 according to an embodiment. The same descriptions of FIGS. 6A and 6B as in FIGS. 1A to 5B will be omitted.

Referring to FIGS. 6A and 6B, the stacked semiconductor package 6 may include a sub semiconductor package 100e, which may be located on a base substrate layer 10b and has a plurality of sub semiconductor chips (e.g., sub semiconductor chips 110, 120, and 130), and a plurality of main semiconductor chips (e.g., main semiconductor chips 210 and 220) stacked on the sub semiconductor package 100e.

The sub semiconductor package 100e may be adhered to a top surface of the base substrate layer 10b such that active surfaces of the plurality of sub semiconductor chips 110, 120, and 130 and a redistribution structure 150e face downward, namely, face the base substrate layer 10b. The redistribution structure 150e may include a redistribution conductive layer 152, a plurality of redistribution pads 154e, and a redistribution insulating layer 156. The sub semiconductor package 100e may be electrically connected to and adhered to the base substrate layer 10b through a plurality of connection bumps 350 located between the plurality of redistribution pads 154e and a plurality of first top connection pads 14a. For example, the sub semiconductor package 100e may be adhered to a top surface of the base substrate layer 10b by using a flip-chip technique.

One or more main semiconductor chips 200 may be adhered to a top surface of the sub semiconductor package 100e. A plurality of main semiconductor chips 200 may be stacked in a staircase form.

A lower main semiconductor chip (e.g., a first main semiconductor chip 210) of the plurality of main semiconductor chips 210 and 220 may be adhered to the top surface of the sub semiconductor package 100e by a second die bonding film 422. The first main semiconductor chip 210 may be adhered to the top surface of the sub semiconductor package 100e and overlap the sub semiconductor package 100e in a direction perpendicular to a main surface of the base substrate layer 10b. Thus, the second die bonding film 422 may cover the entire top surface of the sub semiconductor package 100e.

The sub semiconductor package 100e may be handled as a semiconductor chip adhered to the top surface of the base substrate layer 10b by using a flip-chip technique. Accordingly, since the plurality of redistribute pads 154e are freely located on a bottom surface of the sub semiconductor package 100e, a limitation on the number of the plurality of redistribution pads 154e may be minimized. Accordingly, the stacked semiconductor package 6 may process a mass signal at a high speed.

Furthermore, since the sub semiconductor package 100e has the same area as each of the plurality of main semiconductor chips 210 and 220, the plurality of main semiconductor chips 210 and 220 may be easily stacked on the sub semiconductor package 100e. Also, the sub semiconductor package 100e located at a lower side may stably support the main semiconductor chips 200 stacked at an upper side. Furthermore, since the sub semiconductor package 100e stably supports the main semiconductor chip 220 stacked on the sub semiconductor package 100e, electrical connection members 320 configured to electrically connect the plurality of main semiconductor chips 210 and 220 with the base substrate layer 10b may be reliably formed.

Figure 7A:
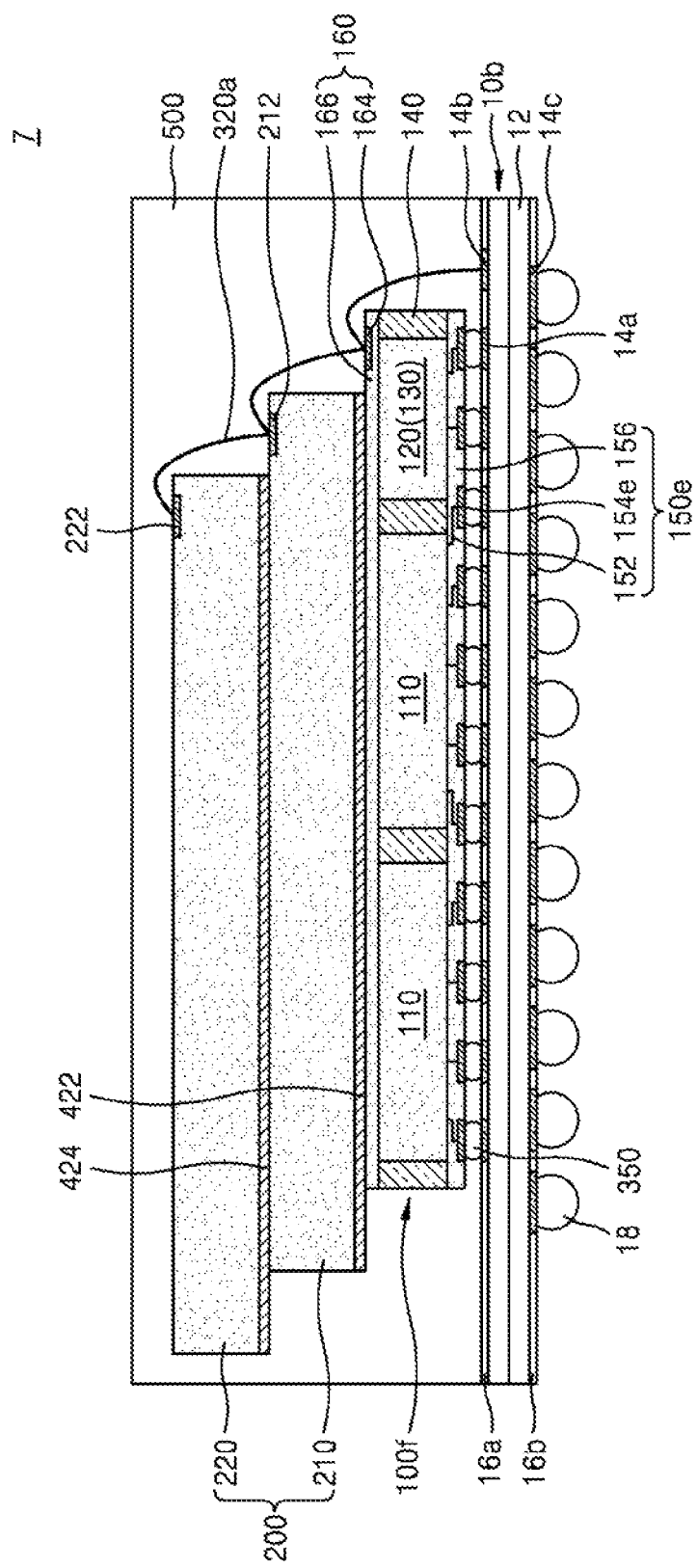
FIGS. 7A and 7B are a cross-sectional view and a plan layout of parts of a stacked semiconductor package according to an embodiment.
Figure 7B:
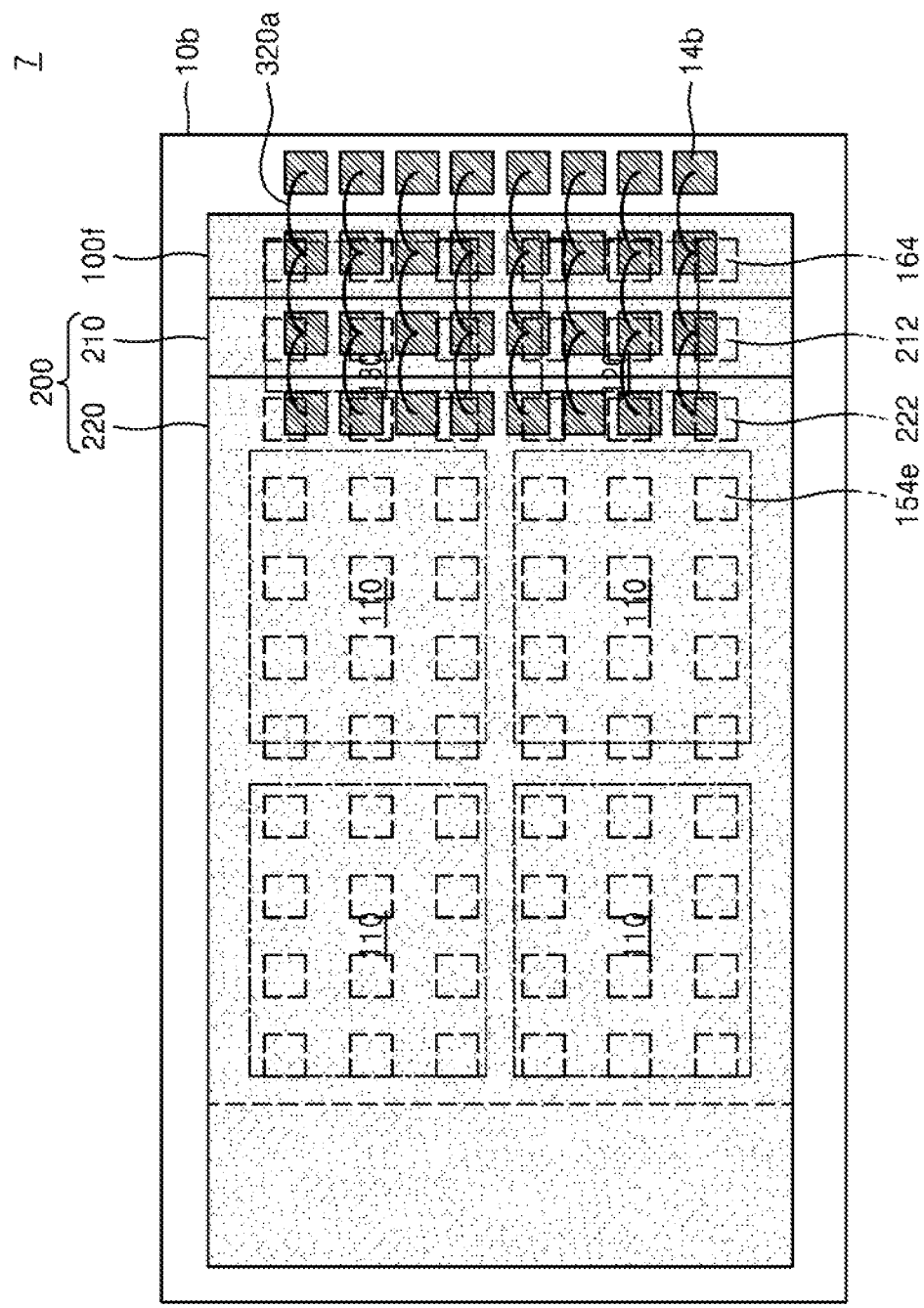

FIGS. 7A and 7B are a cross-sectional view and a plan layout of parts of a stacked semiconductor package 7 according to an embodiment. The same descriptions of FIGS. 7A and 7B as in FIGS. 1A to 6B will be omitted.

Referring to FIGS. 7A and 7B, the stacked semiconductor package 7 may include a sub semiconductor package 100f, which may be located on a base substrate layer 10b and have a plurality of sub semiconductor chips 110, 120, and 130, and a plurality of main semiconductor chips 210 and 220 stacked on the sub semiconductor package 100f.

The sub semiconductor package 100f may include a first redistribution structure 150e, which may be formed on active surfaces of the plurality of sub semiconductor chips 110, 120, and 130 and on a sub mold layer 140, and a second redistribution structure 160, which may be formed on inactive surfaces of the plurality of sub semiconductor chips 110, 120, and 130 and on the sub mold layer 140.

Since the first redistribution structure 150e of the sub semiconductor package 100f has the same structure as the redistribution structure 150e of the sub semiconductor package 100e described with reference to FIGS. 6A and 6B, detailed descriptions thereof will be omitted.

The second redistribution structure 160 of the sub semiconductor package 100f may include a plurality of dummy redistribution pads 164 and a dummy redistribution insulating layer 166. Although the second redistribution structure 160 is formed by using a similar method to a method of forming the first redistribution structure 150e, the second redistribution structure 160 does not include additional redistribution patterns connected to the plurality of sub semiconductor chips 110, 120, and 130 included in the sub semiconductor package 100f.

The dummy redistribution insulating layer 166 may be formed on the inactive surfaces of the plurality of sub semiconductor chips 110, 120, and 130 and on the sub mold layer 140 and cover the inactive surfaces of the plurality of sub semiconductor chips 110, 120, and 130 and the sub mold layer 140. The dummy redistribution insulating layer 166 may include, for example, oxide, nitride, or oxynitride. In some embodiments, the formation of the dummy redistribution insulating layer 166 may include coating the inactive surfaces of the sub semiconductor chips 110, 120, and 130 and the sub mold layer 140 with a resin material (e.g., a PID) including epoxy or polyimide and curing the resin material including epoxy or polyimide or include adhering a build-up film, such as an ABF, to the inactive surfaces of the sub semiconductor chips 110, 120, and 130 and the sub mold layer 140.

The plurality of dummy redistribution pads 164 are not electrically connected to internal circuitry of the plurality of sub semiconductor chips 110, 120, and 130 included in the sub semiconductor package 100f but are electrically floated in the second redistribution structure 160.

Of a portion of a top surface of the sub semiconductor package 100f, which is exposed by the plurality of main semiconductor chips 210 and 220, the plurality of redistribution pads 164 may be formed on a portion of the exposed portion adjacent to one side of the top surface of the sub semiconductor package 100f. Specifically, the plurality of dummy redistribution pads 164 may be formed on the portion of the top surface of the sub semiconductor package 100f, which is adjacent to one side of the sub semiconductor package 100f at which steps of a staircase structure formed by the plurality of main semiconductor chips 210 and 220 descend.

Second electrical connection members 320a configured to connect the plurality of main semiconductor chips 210 and 220 with the base substrate layer 10b may pass through the dummy redistribution pads 164. The second electrical connection members 320a may sequentially connect second wire connection pads 222 of the second main semiconductor chip 220, first wire connection pads 212 of the first main semiconductor chip 210, the dummy redistribution pads 164 of the sub semiconductor package 100e, and second top connection pads 14b of the base substrate layer 10b.

FIGS. 8A to 8F are cross-sectional views of sequential process operations of a method of manufacturing a sub semiconductor package according to an embodiment. Specifically, FIGS. 8A to 8F are cross-sectional views of sequential process operations of a method of manufacturing a sub semiconductor package 100 included in the stacked semiconductor package 1 shown in FIGS. 1A and 1B.

Referring to FIG. 8A, a plurality of sub semiconductor chips (e.g., sub semiconductor chips 110, 120, and 130) may be located on a first support substrate 50. The plurality of sub semiconductor chips 110, 120, and 130 may be located on the first support substrate 50 such that active surfaces of the sub semiconductor chips 110, 120, and 130 face upward. The sub semiconductor chips 110, 120, and 130 may be located apart from one another on the first support substrate 50 (e.g., in a horizontal direction, to have spaces therebetween). In some embodiments, the first support substrate 50 may be a semiconductor wafer.

The plurality of sub semiconductor chips 110, 120, and 130 may be adhered to a top surface of the first support substrate 50 by a first release film 60. The first release film 60 may include a single layer or a multi-layered structure including release layers respectively adhered to two surfaces of a backbone layer. The backbone layer may include, for example, a thermoplastic polymer. The release layer may include, for example, a copolymer of acryl and silicone.

Figure 8B:
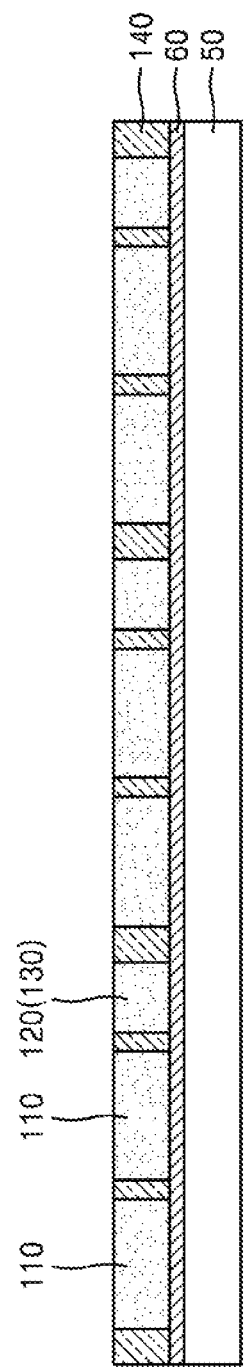

Referring to FIG. 8B, a sub mold layer 140 may be formed on the first support substrate 50 and fill respective spaces between the plurality of sub semiconductor chips 110, 120, and 130. The sub mold layer 140 may not cover a top surface of each of the plurality of sub semiconductor chips 110, 120, and 130 but surrounds only a side surface of each of the plurality of sub semiconductor chips 110, 120, and 130. A top surface of the sub mold layer may be coplanar with top surfaces of the sub semiconductor chips 110, 120, and 130.

Figure 8C:
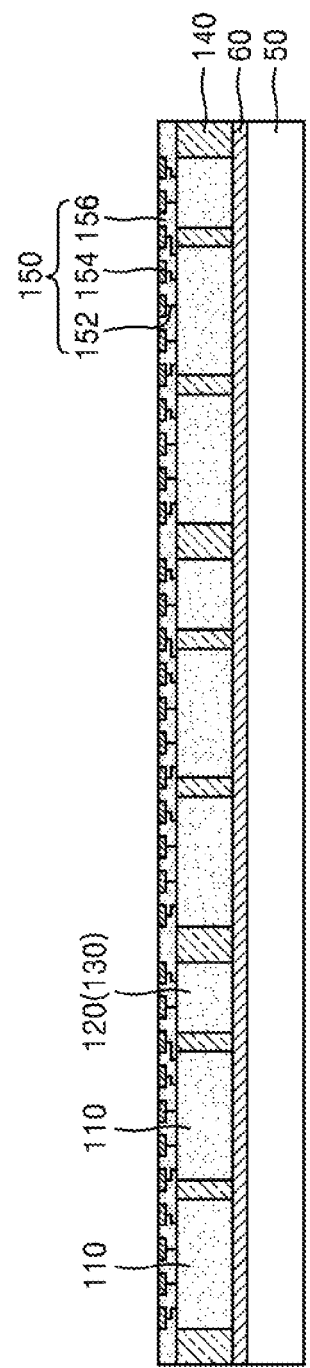

Referring to FIG. 8C, a redistribution structure 150 may be formed on the active surfaces of the plurality of sub semiconductor chips 110, 120, and 130 and on the sub mold layer 140.

The redistribution structure 150 may include a redistribution conductive layer 152, a plurality of redistribution pads 154, and a redistribution insulating layer 156.

The redistribution conductive layer 152 may include a redistribution pattern layer having at least one layer and a redistribution via layer having at least one layer configured to connect at least portions of the plurality of sub semiconductor chips 110, 120, and 130, to the redistribution pattern layer, and the redistribution pads 154. The redistribution pads 154 may be electrically connected to at least some of the plurality of sub semiconductor chips 110, 120, and 130 through the redistribution conductive layer 152. The redistribution insulating layer 156 may be formed on the active surfaces of the plurality of sub semiconductor chips 110, 120, and 130 and on the sub mold layer 140 and cover the redistribution conductive layer 152 and expose the plurality of redistribution pads 154. The redistribution insulating layer 156 may include a single layer or a multi-layered structure depending on a structure of the redistribution conductive layer 152.

The redistribution structure 150 may be formed by using a typical method of forming redistribution structures, which has been used or may be used in semiconductor manufacturing processes. Thus, detailed processes of forming the redistribution structure 150 will be omitted.

After the redistribution structure 150 is formed, the first release film 60 and the first support substrate 50 may be removed.

Figure 8D:
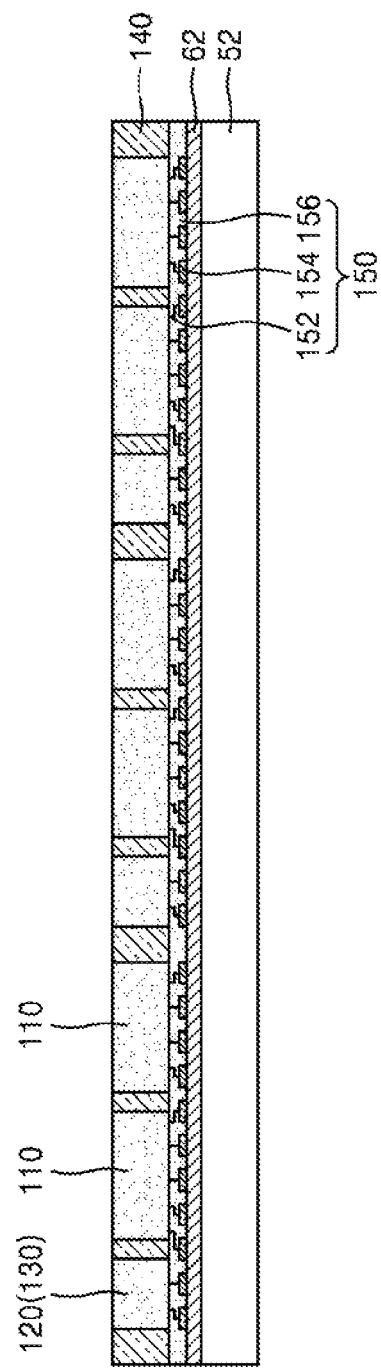

Referring to FIG. 8D, the resultant structure including the redistribution structure 150 shown in FIG. 8C may be adhered to a top surface of a second support substrate 52 with a second release film 62 therebetween so that the redistribution structure 150 may face the second release film 62. The second support film 52 and the second release film 62 may be similar to the first support film 50 and the first release film 60, respectively, and thus detailed descriptions thereof will be omitted.

Figure 8E:
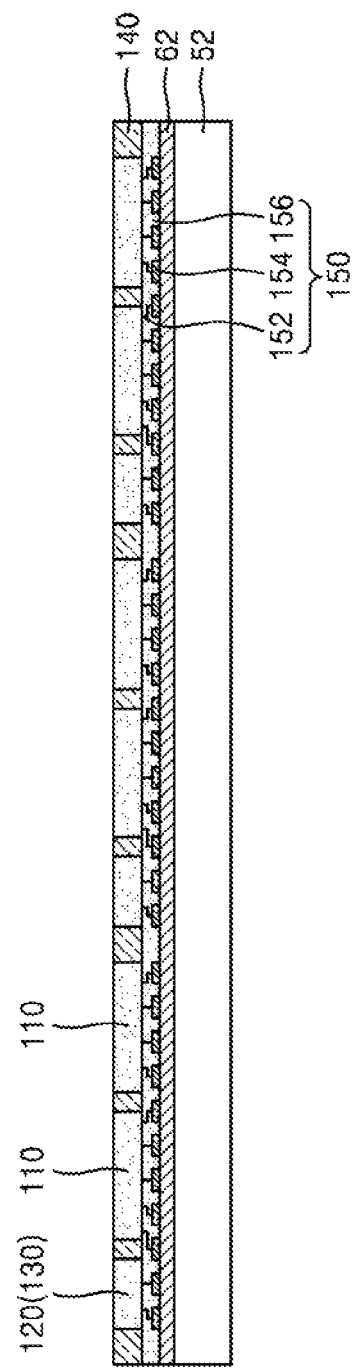

Referring to FIG. 8E, portions of the plurality of sub semiconductor chips 110, 120, and 130 and the sub mold layer 140 may be optionally removed from inactive surfaces of the plurality of sub semiconductor chips 110, 120, and 130. Thus, a thickness of a structure including the sub semiconductor chips 110, 120, and 130 and the sub mold layer 140 may be reduced.

Figure 8F:
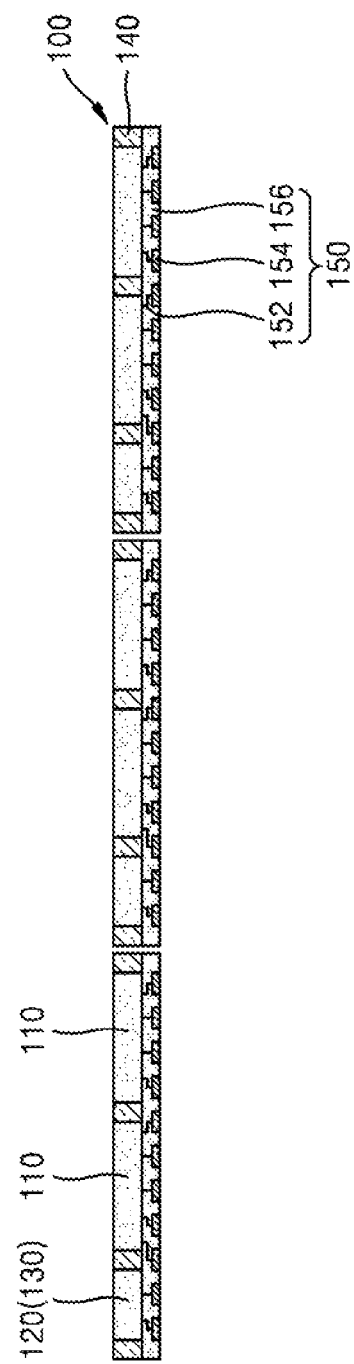

Referring to FIG. 8F, the structure including the plurality of sub semiconductor chips 110, 120, and 130 and the sub mold layer 140 may be separated into a plurality of sub semiconductor packages 100. In this case, the redistribution structure 150 may serve as a package substrate, and may be described as a sub package substrate.

Furthermore, the sub semiconductor packages 100a and 100b included in the stacked semiconductor packages 2 and 5 shown in FIGS. 2A, 2B, 5A, and 5B may be manufactured by using the methods described with reference to FIGS. 8A to 8F.

Figure 9:
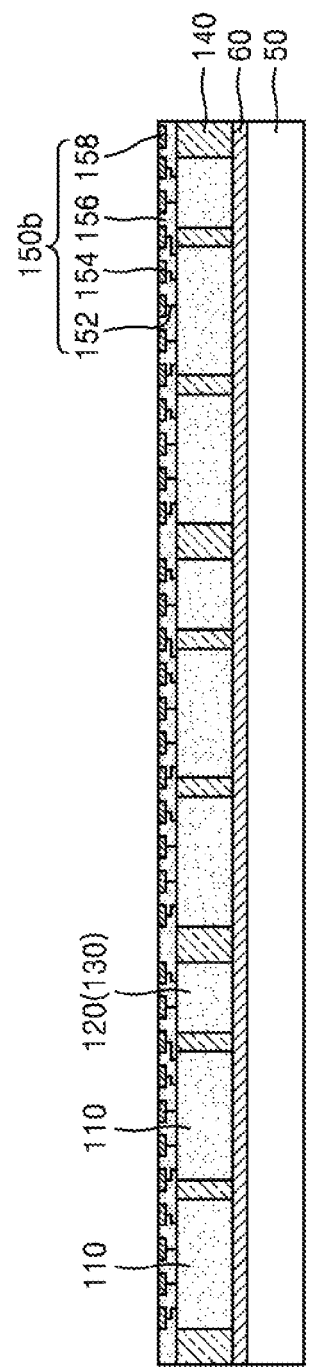
FIG. 9 is a cross-sectional view of a method of manufacturing a sub semiconductor package according to an embodiment.

FIG. 9 is a cross-sectional view of a method of manufacturing a sub semiconductor package according to an embodiment. Specifically, FIG. 9 is a cross-sectional view of a method of manufacturing the sub semiconductor package 100b included in the stacked semiconductor package 3 shown in FIGS. 3A and 3B.

Referring to FIG. 9, as described with reference to FIGS. 8A and 8B, after a plurality of sub semiconductor chips 110, 120, and 130 are located on a support substrate 50, a sub mold layer 140 may be formed to fill respective spaces between the plurality of sub semiconductor chips 110, 120, and 130.

Subsequently, as described with reference to FIG. 8C, a redistribution structure 150b may be formed on active surfaces of the plurality of sub semiconductor chips 110, 120, and 130 and on the sub mold layer 140. The redistribution structure 150b may include a redistribution conductive layer 152, a plurality of redistribution pads 154, a redistribution insulating layer 156, and a plurality of dummy pads 158.

In some embodiments, the plurality of dummy pads 158 may be formed during the formation of the plurality of redistribution pads 154. The plurality of dummy pads 158 may not be electrically connected to internal circuitry of the plurality of sub semiconductor chips 110, 120, and 130 but may be electrically floated in the redistribution structure 150b.

Thereafter, the sub semiconductor package 100b may be formed with reference to the descriptions of FIGS. 8D to 8F.

In addition, the sub semiconductor package 100c included in the stacked semiconductor package 4 shown in FIGS. 4A and 4B may be manufactured with reference to the method described with reference to FIG. 9.

Figure 10A:
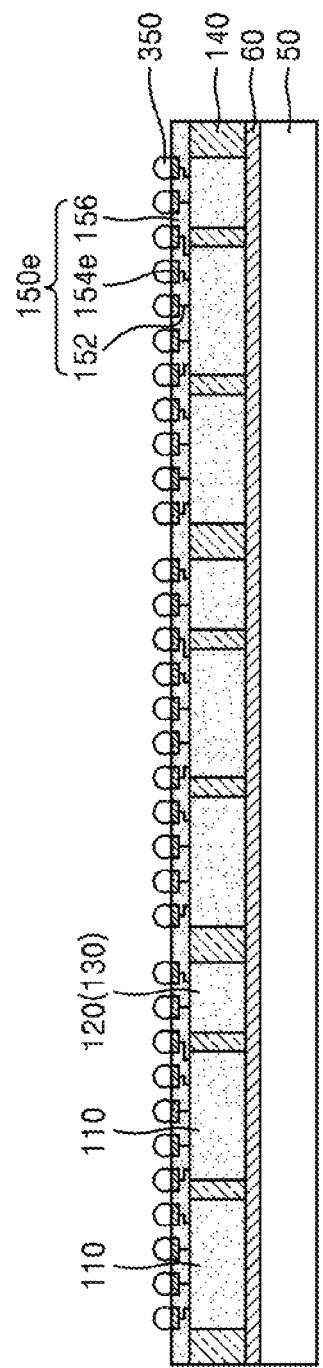
FIGS. 10A to 10C are cross-sectional views of sequential process operations of a method of manufacturing a sub semiconductor package according to an embodiment.
Figure 10B:
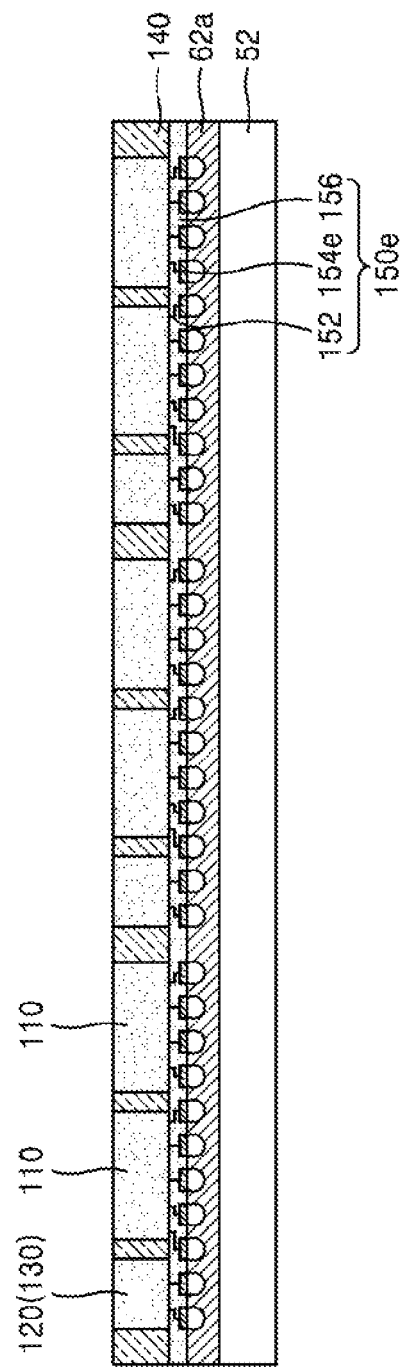
Figure 10C:
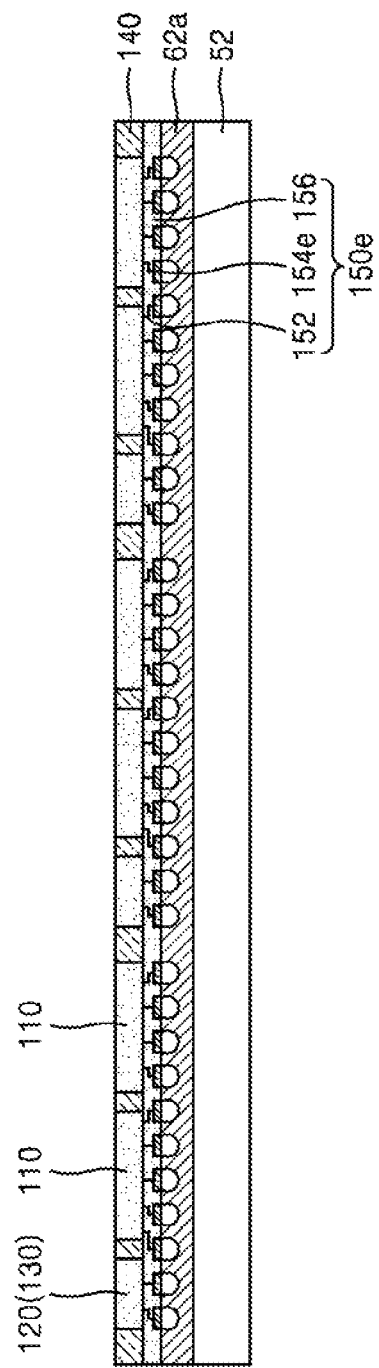

FIGS. 10A to 10C are cross-sectional views of sequential process operations of a method of manufacturing a sub semiconductor package according to an embodiment. Specifically, FIGS. 10A to 10C are cross-sectional views of sequential process operations of a method of manufacturing the sub semiconductor package 100e and the connection bumps 350 included in the stacked semiconductor package 6 shown in FIGS. 6A and 6B.

Referring to FIG. 10A, as described with reference to FIGS. 8A to 8C, after a plurality of sub semiconductor chips 110, 120, and 130 are located on a support substrate 50, a sub mold layer 140 may be formed to fill respective spaces between the plurality of sub semiconductor chips 110, 120, and 130. A redistribution structure 150e may be formed on active surfaces of the plurality of sub semiconductor chips 110, 120, and 130 and on the sub mold layer 140.

Thereafter, connection bumps 350 may be formed on redistribution pads 154e.

After the connection bumps 350 are formed, a first release film 60 and a first support substrate 50 may be removed.

Referring to FIG. 10B, the resultant structure including the connection bumps 350 shown in FIG. 10A may be adhered to a top surface of a second support structure 52 with a second release film 62a therebetween so that the redistribution structure 150e may face the second release film 62a.

Referring to FIG. 10C, portions of the plurality of sub semiconductor chips 110, 120, and 130 and the sub mold layer 140 may be optionally removed from inactive surfaces of the plurality of sub semiconductor chips 110, 120, and 130. Thus, a thickness of a structure including the plurality of sub semiconductor chips 110, 120, and 130 and the sub mold layer 140 may be reduced.

Subsequently, the sub semiconductor package 100e may be formed in the same manner as described with reference to FIG. 8F.

Figure 11:
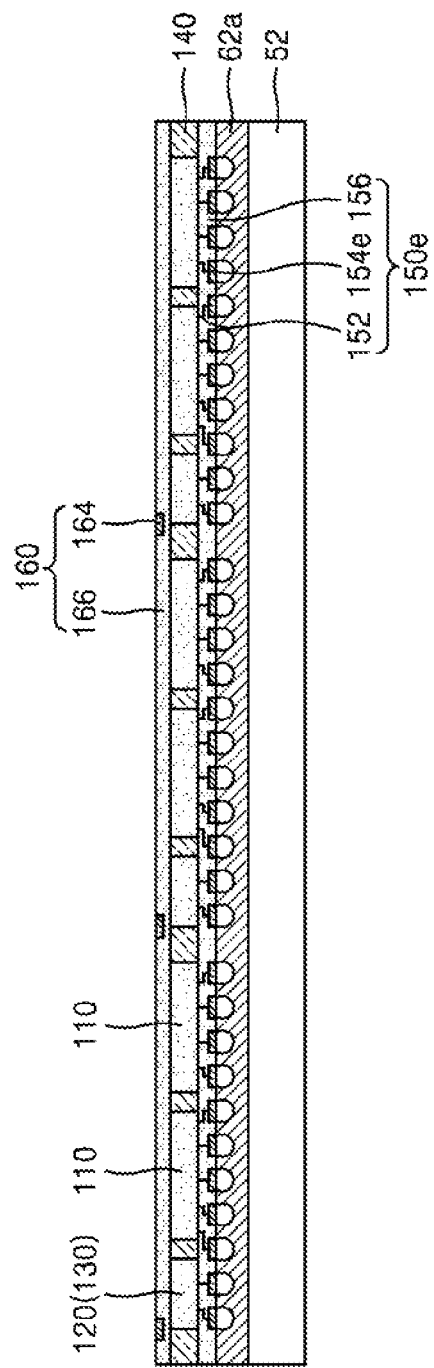
FIG. 11 is a cross-sectional view of a method of manufacturing a sub semiconductor package according to an embodiment.

FIG. 11 is a cross-sectional view of a method of manufacturing a sub semiconductor package according to an embodiment. Specifically, FIG. 11 is a cross-sectional view of a method of manufacturing the sub semiconductor package 100f included in the stacked semiconductor package 7 shown in FIGS. 7A and 7B.

Referring to FIG. 11, after the method described with reference to FIGS. 10A to 10C is performed, a second redistribution structure 160 may be formed on inactive surfaces of the plurality of sub semiconductor chips 110, 120, and 130 and on the sub mold layer 140. The second redistribution structure 160 may include a plurality of dummy redistribution pads 164 and a dummy redistribution insulating layer 166. The plurality of dummy redistribution pads 164 may not be electrically connected to internal circuitry of the plurality of sub semiconductor chips 110, 120, and 130 but may be electrically floated in the second redistribution structure 160.

Subsequently, the sub semiconductor package 100f may be formed in the same manner as described with reference to FIG. 8F.

Figure 12:
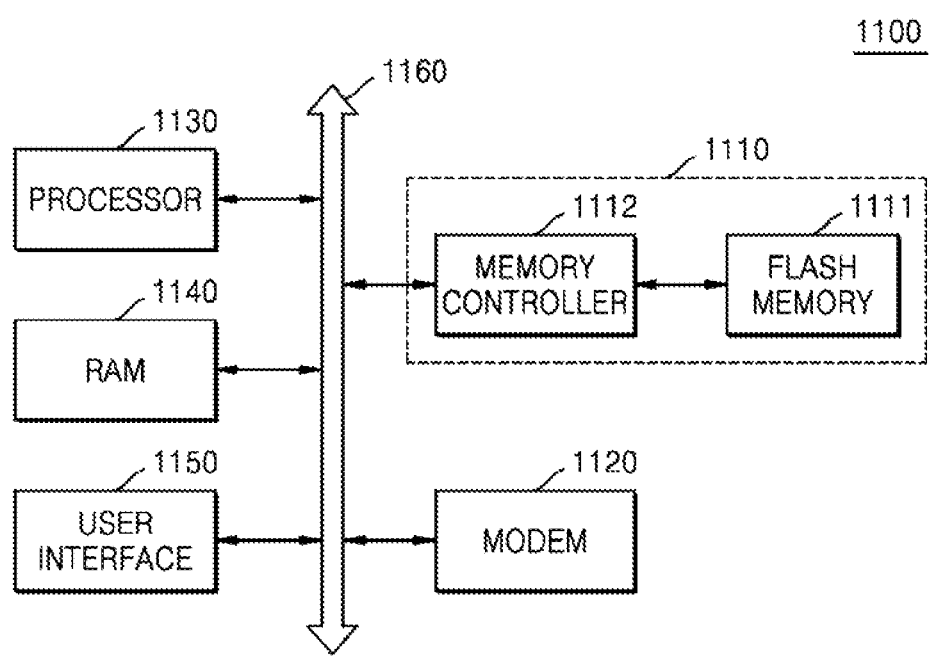
FIG. 12 is a block diagram of a system according to an embodiment.

FIG. 12 is a block diagram of a system 1100 according to an embodiment.

Referring to FIG. 12, the system 1100 may include a processor 1130 (e.g., a central processing unit (CPU)), random access memory (RAM) 1140, a user interface 1150, and a modem 1120, which may communicate with one another through a common bus 1160.

The elements of the system 1100 may transmit and receive signals to and from a storage device 1110 through the common bus 1160. The storage device 1110 may include a flash memory 1111 and a memory controller 1112. The flash memory 1110 may store data and have non-volatile characteristics so that even if power supply is interrupted, data stored in the flash memory 1110 may be still retained. The storage device 1110 and the RAM 1140 may include any one of the stacked semiconductor packages 1, 2, 3, 4, 5, 6, and 7 described with reference to FIGS. 1A to 11.

Accordingly, the system 1100 according to the present embodiment may be downscaled and have a high capacity because the storage device 1110 and the RAM 1140 may be embodied together by using a single stacked semiconductor package. Also, a process of manufacturing a stacked semiconductor package to form both the storage device 1110 and the RAM 1140 may be simplified. Furthermore, reliability of the stacked semiconductor package may improve, and a thickness of the stacked semiconductor package may be reduced. Therefore, the system 1100 according to the present embodiment may be downscaled and improve in terms of reliability.

While the present disclosure has been particularly shown and described with reference to embodiments thereof, it will be understood that various changes in form and details may be made therein without departing from the spirit and scope of the following claims.

What is claimed is:

1. A stacked semiconductor package comprising:
a base substrate layer;
a sub semiconductor package disposed on a top surface of the base substrate layer, the sub semiconductor package comprising:
a plurality of sub semiconductor chips spaced horizontally apart from one another,
a sub mold layer filling spaces between the plurality of sub semiconductor chips to surround side surfaces of the plurality of sub semiconductor chips, and
a redistribution structure provided on active surfaces of the plurality of sub semiconductor chips and between the base substrate layer and the sub mold layer, the redistribution structure comprising redistribution pads electrically connected to the base substrate layer and a redistribution conductive layer configured to connect at least some of the plurality of sub semiconductor chips with the redistribution pads; and
at least one main semiconductor chip stacked on the sub semiconductor package;

wherein the sub semiconductor package is adhered to the top surface of the base substrate layer such that the active surfaces of the plurality of sub semiconductor chips face the base substrate layer,
wherein the at least one main semiconductor chip includes a plurality of main semiconductor chips stacked in a staircase form, and
wherein a lowermost main semiconductor chip of the plurality of main semiconductor chips is stacked on the sub semiconductor package in a staircase form.

2. The stacked semiconductor package of claim 1, wherein the sub semiconductor package is electrically connected to the base substrate layer through connection bumps located on the redistribution pads.

3. The stacked semiconductor package of claim 1, wherein the sub semiconductor package has the same area from a plan view as each main semiconductor chip of the at least one main semiconductor chip.

4. The stacked semiconductor package of claim 1, wherein the at least one main semiconductor chip is electrically connected to the base substrate layer through bonding wires.

5. The stacked semiconductor package of claim 1, wherein, in a direction toward a main surface of the base substrate layer, a direction traversed for which steps of a staircase structure formed by the lowermost main semiconductor chip and the sub semiconductor package ascend is the same as a direction traversed for which steps of a staircase structure formed by the plurality of main semiconductor chips ascend.

6. The stacked semiconductor package of claim 1, wherein the sub semiconductor package has the same thickness in a vertical direction as at least a first main semiconductor chip of the at least one main semiconductor chip.

7. A stacked semiconductor package comprising:
a base substrate layer;
a sub semiconductor package disposed on the base substrate layer and comprising a plurality of sub semiconductor chips spaced horizontally apart from one another, a sub mold layer filling spaces between the plurality of sub semiconductor chips, and a redistribution structure including redistribution pads and a redistribution conductive layer configured to connect at least some of the plurality of sub semiconductor chips with the redistribution pads, the redistribution structure being on active surfaces of the plurality of sub semiconductor chips and between the base substrate layer and the sub mold layer, the sub semiconductor package being adhered to the base substrate layer such that the active surfaces of the plurality of sub semiconductor chips face the base substrate layer; and
a plurality of main semiconductor chips, each of which has the same area as the sub semiconductor package, the plurality of main semiconductor chips being stacked on the sub semiconductor package in a staircase form.

8. The stacked semiconductor package of claim 7, wherein each semiconductor chip of the plurality of main semiconductor chips has an area when viewed from a top down view larger than that of each sub semiconductor chip of the plurality of sub semiconductor chips.

9. The stacked semiconductor package of claim 7, wherein a surface of the sub mold layer facing the redistribution structure is coplanar with the active surfaces of the plurality of sub semiconductor chips.

10. The stacked semiconductor package of claim 7, wherein the sub semiconductor package is electrically connected to the base substrate layer through connection bumps located on the redistribution pads.

11. A stacked semiconductor package comprising:
- a base package substrate;
- a sub semiconductor package disposed on the base package substrate, the sub semiconductor package including:
- a sub package substrate;
- a plurality of first semiconductor chips disposed on the sub package substrate and horizontally spaced apart from each other, at least two of which have different areas from each other, when viewed from a plan view; and
- a sub mold layer disposed on the sub package substrate and filling spaces between the first semiconductor chips;
- at least a second semiconductor chip disposed on the sub semiconductor package, the second semiconductor chip having a larger area than each first semiconductor chip of the plurality of first semiconductor chips, when viewed from a plan view; and
- a mold layer covering the sub semiconductor package and the second semiconductor chip,
- wherein the sub semiconductor package has the same area as the second semiconductor chip, when viewed from a plan view, and is adhered to the base package substrate such that active surfaces of the plurality of first semiconductor chips face the base package substrate.

12. The stacked semiconductor package of claim 11, wherein the sub package substrate is a redistribution structure including redistribution pads and a redistribution conductive layer configured to connect at least some of the plurality of first semiconductor chips with the redistribution pads.

13. The stacked semiconductor package of claim 12, wherein the base package substrate includes top connection pads for connecting to the redistribution pads.

14. The stacked semiconductor package of claim 13, wherein the base package substrate includes additional top connection pads for connecting to respective wire connection pads formed on the second semiconductor chip.

15. The stacked semiconductor package of claim 11, wherein the sub semiconductor package is disposed between the base package substrate and the second semiconductor chip.

16. The stacked semiconductor package of claim 11, further comprising:
- a third semiconductor chip of the same type and size as the second semiconductor chip, stacked on the second semiconductor chip.

17. The stacked semiconductor package of claim 16, wherein at least one of the second semiconductor chip and third semiconductor chip overhangs the sub semiconductor package.

* * * * *